United States Patent [19]

Ohnishi et al.

[11] Patent Number: 5,319,353
[45] Date of Patent: Jun. 7, 1994

[54] ALARM DISPLAY SYSTEM FOR AUTOMATIC TEST HANDLER

[75] Inventors: Takeshi Ohnishi, Saitama, Japan; Diane D. Kakihara, San Diego, Calif.

[73] Assignee: Advantest Corporation, Tokyo, Japan

[21] Appl. No.: 960,933

[22] Filed: Oct. 14, 1992

[51] Int. Cl.$^5$ .............................................. G08B 25/00
[52] U.S. Cl. ...................................... 340/525; 340/500; 340/514; 364/188; 209/571; 209/573; 73/865.6
[58] Field of Search ............... 340/525, 506, 500, 501, 340/514; 364/188; 371/3, 29.1; 209/571, 573; 414/148, 795.3, 798; 73/865.6

[56] References Cited

U.S. PATENT DOCUMENTS

| 4,001,807 | 1/1977 | Dallimonti | 340/525 |
| 4,294,066 | 10/1981 | Lane | 340/525 |
| 4,715,501 | 12/1987 | Sato et al. | 209/573 |
| 4,760,924 | 8/1988 | Sato et al. | 209/573 |
| 4,816,208 | 3/1989 | Woods et al. | 340/525 |
| 4,926,118 | 5/1990 | O'Connor et al. | 209/573 |

Primary Examiner—Donnie L. Crosland
Attorney, Agent, or Firm—Knobbe, Martens, Olson & Bear

[57] ABSTRACT

An alarm display system for automatic test handling of electric devices such as integrated circuits ("ICs"), semiconductor chips and the like, is capable of notifying and displaying an occurrence of an error or other inadequacies in the automatic test handler, a generic position and a specific position of the error in the test handler. The test handler wherein the alarm display system of the present invention is to be included has improved IC transfer, test sequence and sorting capabilities in order to provide enhanced productivity and reliability for the testing of integrated circuits. The alarm display system is capable of showing an error and its position, and at the same time, when there is no error, controlling and displaying a general procedure of the test handler. The alarm display comprises a controller for controlling a total operational procedure for detecting and displaying an error in the test handler based on signals from various sensors in addition to an over all handling and testing operation, a general purpose display such as a cathode ray tube or a plasma display panel for showing an occurrence of error or erroneous operation in the test handler and a general position and specific position of the error, and a plurality of sensors for monitoring and sensing the movement of the electronic devices to be tested and other parameters such as temperature in a temperature chamber, air pressure in a compressed air system and the like in the test handler.

11 Claims, 14 Drawing Sheets

ALARM DISPLAY SYSTEM FOR AUTOMATIC TEST HANDLER

FIELD OF THE INVENTION

This invention relates to alarm display system for an automatic test handler for testing electric devices such as integrated circuits ("ICs"), semiconductor chips and the like, and, more particularly, to an improved alarm display system which is capable of displaying both generic and specific positions of an error in a test handler having improved IC transfer, test sequence and sorting capabilities in order to provide enhanced productivity and reliability for the testing of integrated circuits.

BACKGROUND OF THE INVENTION

In the electronics industry, there is a constant demand for electronic devices, such as integrated circuits (ICs) or semiconductor chips, to be produced less expensively and in smaller dimensions. One way to increase productivity of such electronic devices, and thereby reduce their unit cost, is to increase the test speed of the devices by testing a plurality of them at the same time.

Such an electronic device test system (IC tester, for example) comprises a master unit for generating various test signals and for evaluating the resulting output signals and an automatic test handler for automatically transferring the devices to be tested to test heads and sorting the tested devices based on the test results. Unfortunately, in a complicated test system for testing a large number of devices at the same time, the test system is not free form errors even when the system utilizes the state of the art technology. For example, this type of mechanical system is subjected to an error referred to as "jamming," wherein two or more electronic devices, or carrier modules and the like, stick together or stick to passages of the test system and cannot separate from one another. If such jamming occurs, it is usually necessary to stop the operation of the test system to clear the jam, thus causing a serious loss of time and decrease of efficiency. The other type of error is a mechanical error which is not directly caused by the devices to be tested but rather the test system itself, such as, for example, mechanical inaccuracy, errors in sensors, temperature control errors, or sorting errors.

Therefore, it is important, in such device testing, or in the automatic test handler to indicate an error in the test system and to accurately identify a position where an error exists as fast as possible so that such errors can be corrected. The faster the identification of the position of errors and the restoration of the normal operating condition, the more efficient the device testing becomes, thus increasing the productivity of the devices. The present invention deals with such an alarm display system for use in an automatic test handler in an electronic device test system to increase the test efficiency and thus to increase the productivity by decreasing the overall time required for the device testing.

In an automatic test handler, it has become a test technology standard to place a number of electronic devices to be tested on a test tray and position them to be engaged by a test head plate having a number of corresponding test contactors. An example of the test system for testing a plurality of electronic devices in a test tray is shown in the U.S. Pat. No. 4,926,118 to O'Connor et al.

In the O'Connor patent, one electronic device is placed on a seat of carrier module, and each carrier module is provided with one or more device seats. A number of modules are then positioned by column and row on the test tray. The test tray, having a number of such carrier modules, is arranged so as to be in vertical alignment (either above or below) with a test fixture.

The test fixture includes test contactors (test pins) for contact with the pins of each electronic device to be tested for supplying and receiving the test signals from the device. Each module is aligned with a corresponding test contactor so that when either the test tray or the test fixture are moved in a vertical direction toward the other, the contactor engages the electronic device positioned within the carrier module.

The contactor is provided with a number of test pins or leads which come into electrical communication with the leads of the electronic devices to be tested. The automatic test handler is electrically connected to a master unit of electronic device test system which includes a test signal generator for supplying a test signal to the device, and with a signal comparator for analyzing the results of the test. Based on such results, the electronic devices are transferred to another location in the test process and sorted for proper handling.

The O'Connor patent does not show how to monitor each operation stage of the test system and identify error positions, such as locations of jamming of the devices to be tested or jamming of the tested devices, or the temperature of the devices during the course of the test processes. Therefore, it requires a considerable amount of time to discover an error position and recover the test system from such errors since there is not an effective means for monitoring and indicating by alarm sounds and an alarm display of such error positions.

In a further conventional test handler, there was an example of alarm display devices to indicate an error position in the test system. An example of such a test handler is shown in FIG. 1. In the test handler 10 of FIG. 1, electronic devices to be tested are removed from their container, usually called a "magazine," and separated from one another by the force of gravity. That is, the electronic device to be tested is positioned in the magazines 14 initially at a vertically higher position of the housing 13 than the test head 19 and, by its own weight, is separated from the other devices such that it slidably descends to the test head 19. After the test, the electronic device descends further, due to gravity, to a lower position of the housing 12 than the test head so as to be sorted in the unloader section 16 into the unloader magazines 18a–18g depending on the test results.

Such conventional device test system, which utilizes the force of gravity to separate and transfer the electronic devices, has a relatively simple structure since the driving force for the device movement is based on the gravity and the number of devices to be simultaneously tested is limited, i.e., two or four. Therefore, the conventional test system 10 shown in FIG. 1 usually employs a display device 11 for showing locations wherein a device jamming had occurred.

An example of such display devices 11 is illustrated in FIG. 2. The display device of FIG. 2 typically employs a printed display plate made of, for example, plastic and light emitting diodes (LEDs) or plasma display panels for showing an error position in the test system. For example, the display panel is illustrated in FIG. 2 as a flow diagram that includes each of the function blocks in the test system. Such function blocks are, for example, loader, distributer, transfer, contactor, sorter and unloader. Each functional block is accompanied by a alarm point comprising an LED, for example, which emits light or blinks when an error occurs in the corresponding function block as shown by pilot lamps PL1-PL6 in FIG. 2. Therefore, the user of the test system is notified by the alarm display and also by the alarm sound that an error exists, and the general position or the function block where the error occurred is indicated.

However, the error display device of this kind has three inherent disadvantages. First, since such display is formed of a single layer of fixed display which only shows each function block of the system, one can tell from such display only a general position or a functional block of the tester which involves an error. Thus, although the alarm display can show that there is an error in the test system and indicate the appropriate position of such error, it is not possible to show a specific or more detailed position or kinds of the error in each of the function blocks. As a result, the alarm display of this kind is not adequate for a more complicated test system.

Second, since such an alarm display system in the conventional test system is a specifically made system for a specific test system with only a single layer of display, it is not possible to show a detailed position with respect to each device or test tray to be tested in a more complicated test system wherein a large number of electric devices are loaded, temperature controlled, transferred and tested, and unloaded in parallel at the same time. Although it may be possible for the conventional alarm display system to be arranged to show more detailed error positions in the test system by increasing the size of the display, it would be necessary to have a display which is impractically large. Therefore, it is impractical in the conventional test handler to install an alarm display system which is capable of showing the detailed information of an error.

Third, since such an alarm display system in the conventional test system is a specifically made system for a specific test system, when a different type of test system is employed, the alarm display system has also to be replaced with the one specifically designed for the type of test system. Therefore, the alarm display system in the conventional test handler is inflexible and cannot be employed in a different type of test handler.

Thus, in summary, an alarm display system for an automatic test handler is necessary which can immediately notify and indicate any errors in the test system for testing a large number of electronic devices at the same time in parallel. At the same time, there is an increasing demand for greater test productivity so as to reduce the cost of IC devices. Moreover, with the increase of the test productivity, the test system becomes more complicated, and thus, it is necessary to indicate a specific position where an error happens to correct the error within a short period of time.

Thus, there is a serious need in the electronic device industry such as in the integrated circuit manufacturers and the like for an alarm display system for automatic test handler which can overcome the problems and disadvantages described above.

SUMMARY OF THE INVENTION

The present invention is directed to an alarm display system for automatic test handling of electric devices such as integrated circuits ("ICs"), semiconductor chips and the like, which is capable of notifying and displaying an occurrence of an error or other inadequacies in the automatic test handler, a generic position and a specific position of the error in the test handler. The test handler wherein the alarm display system of the present invention is to be included has improved IC transfer, test sequence and sorting capabilities in order to provide enhanced productivity and reliability for the testing of integrated circuits.

The present invention is an improved alarm display system which is capable of showing an error and its position, and at the same time, when there is no error, controlling and displaying a general procedure of the test handler. The alarm display of the present invention comprises a controller for controlling a total operational procedure for detecting and displaying an error in the test handler based on signals from various sensors in addition to an overall handling and testing operation, a general purpose display such as a cathode ray tube (CRT) or a plasma display panel for showing an occurrence of error or an erroneous operation in the test handler and for showing a general position and specific position of the error, and a plurality of sensors for monitoring and sensing the movement of the electronic devices to be tested and other parameters such as temperature in a temperature chamber, air pressure in a compressed air system and the like in the test handler.

The alarm display system of the present invention is capable of showing general functional blocks of the test handler and more detailed graphical diagram of each functional block in multiple layer display format when an error occurred in the test handler. The alarm display system of the present invention generally shows an operating state when no error or inadequacy has happened in the test handler, and automatically emits an alarm sound and alarm light, and moves to an alarm display state if there is an error in the test handler. In a case where such an error exists, the alarm display is first set to a main alarm screen which shows a overall positional diagram which graphically indicates the general position or the functional blocks of the test handler. The display flickers the indicator illustrated in the graphic display which corresponds to the functional block of the test handler wherein the error happened.

Furthermore, the present alarm display system provides for the accurate location of the errors in the test handler by means of a plurality of layers of alarm display. In the state of the main alarm screen, a first message identifies to the user which functional block the error happened. Then, the user presses a function key on the main alarm screen for a detailed view of the message shown in the main alarm screen so that a more detailed illustration of the target functional block is obtained on the screen. In the detailed screen, the functional block which indicates the occurrence of error is illustrated in more detail to show symbols of elements such as movable parts in the designated functional block, for example, and an indicator corresponding to the part which involves an error flickers or blinks to indicate the location of the error.

Furthermore, the alarm display system of the present invention is able to achieve maximum efficiency and applicability by the use of a general purpose control unit and display. That is, unlike the conventional alarm display which utilizes a specifically printed display panel, the present invention utilizes an commercially available microcomputer unit as a control unit and a conventional display device such as a cathode ray tube or a plasma display panel. Thus, the alarm display can perform its alarm indicating functions without using parts or components specifically made for specific functions of a test handler.

Finally, since the errors and jamming can be located in a very short time by utilizing the main alarm screen and the lower level screens for the detailed view of the functional blocks involving the errors. As a result, the correction of the errors or the maintenance of the test handler can be accomplished in a short period of time. Thus, the alarm display system of the present invention can maximize its efficiency by minimizing the dead time of the test handler. invention provides for precise and accurate location of the errors in the automatic test handler in order to maximize throughput in the electronic device testing.

BRIEF DESCRIPTION OF THE DRAWINGS

FIG. 3a is an exploded view of a customer tray and tray magazine and tray elevator in the automatic test handler of FIG. 3.

DETAILED DESCRIPTION OF THE INVENTION

Figure 1:
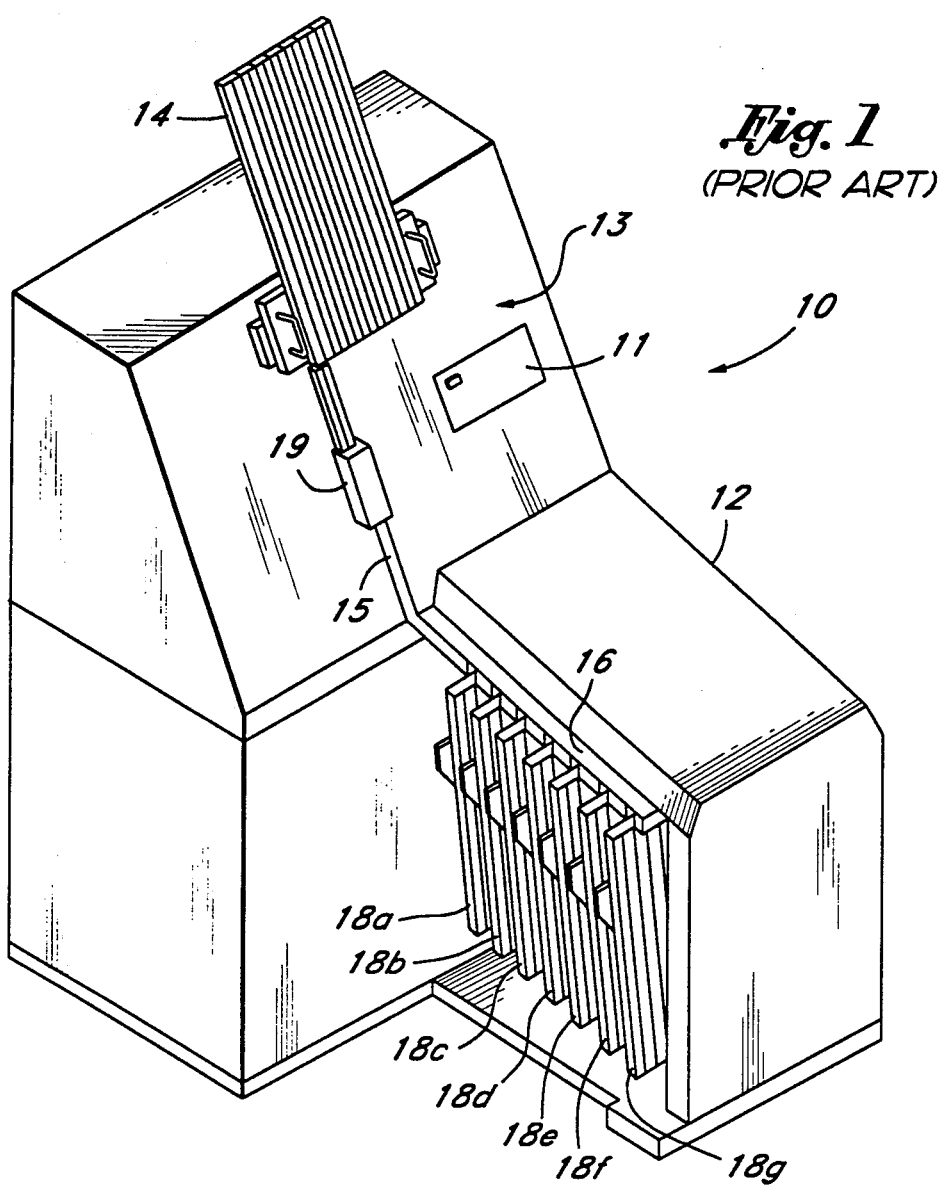
FIG. 1 is a perspective view of an example of the conventional automatic test handler for automatically loading, testing, sorting and unloading electronic devices such as integrated circuits (ICs).
Figure 2:
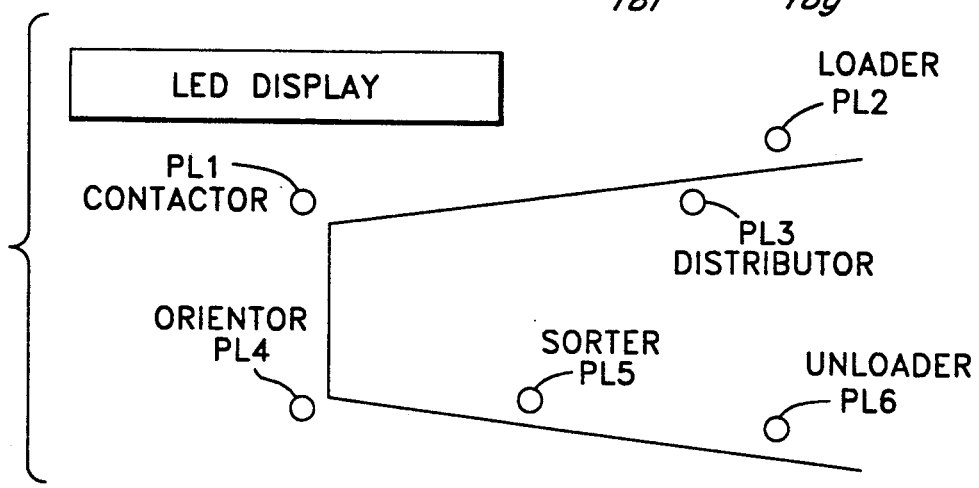
FIG. 2 is a schematic showing an example of alarm display for indicating error positions of the test handler which is typically used in the conventional automatic test handler of FIG. 1.
Figure 3:
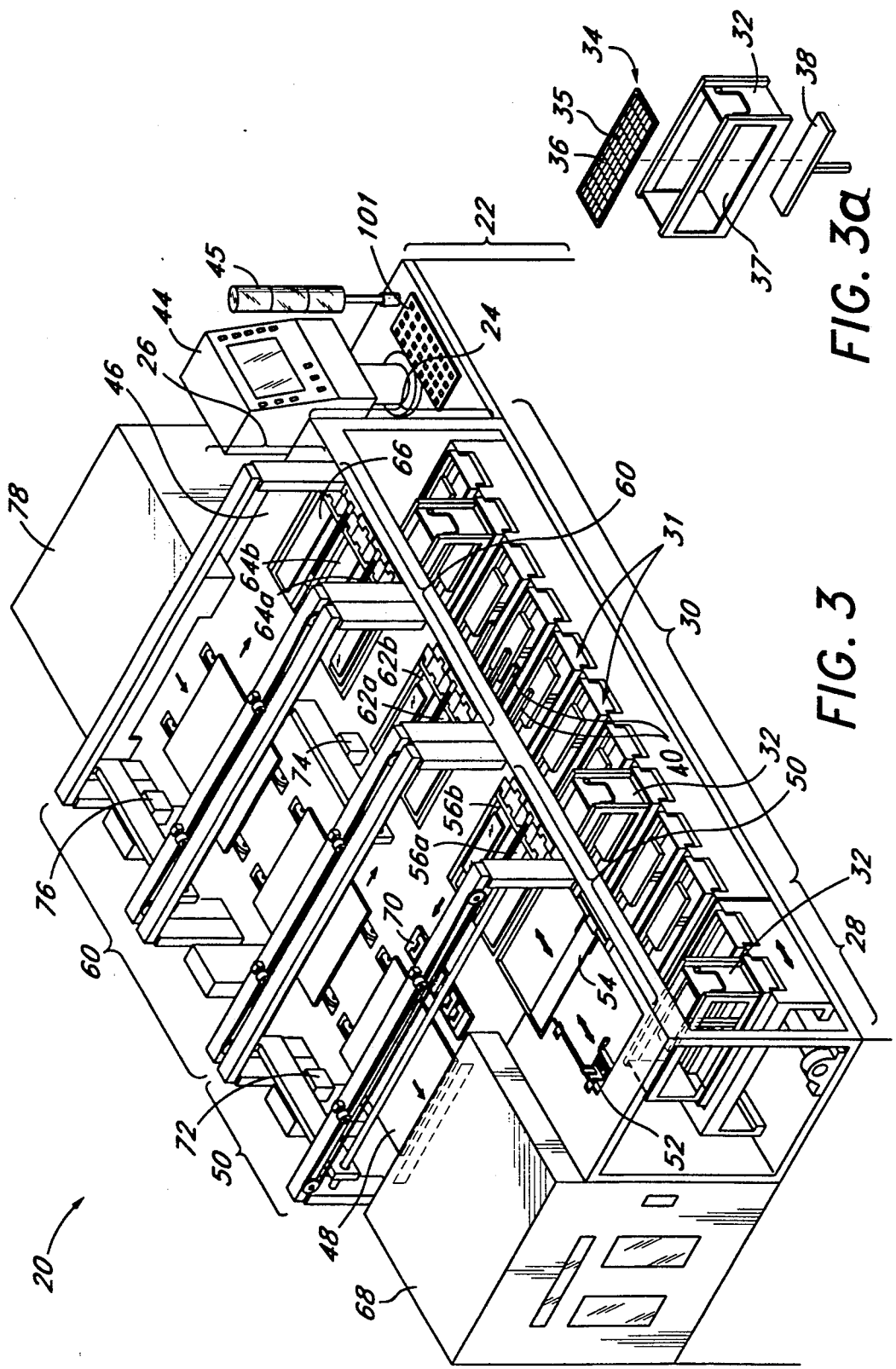
FIG. 3 is a perspective view of an example of the modern automatic test handler illustrating the primary components of the handler in which the alarm display system of the present invention is employed.
Figure 4:
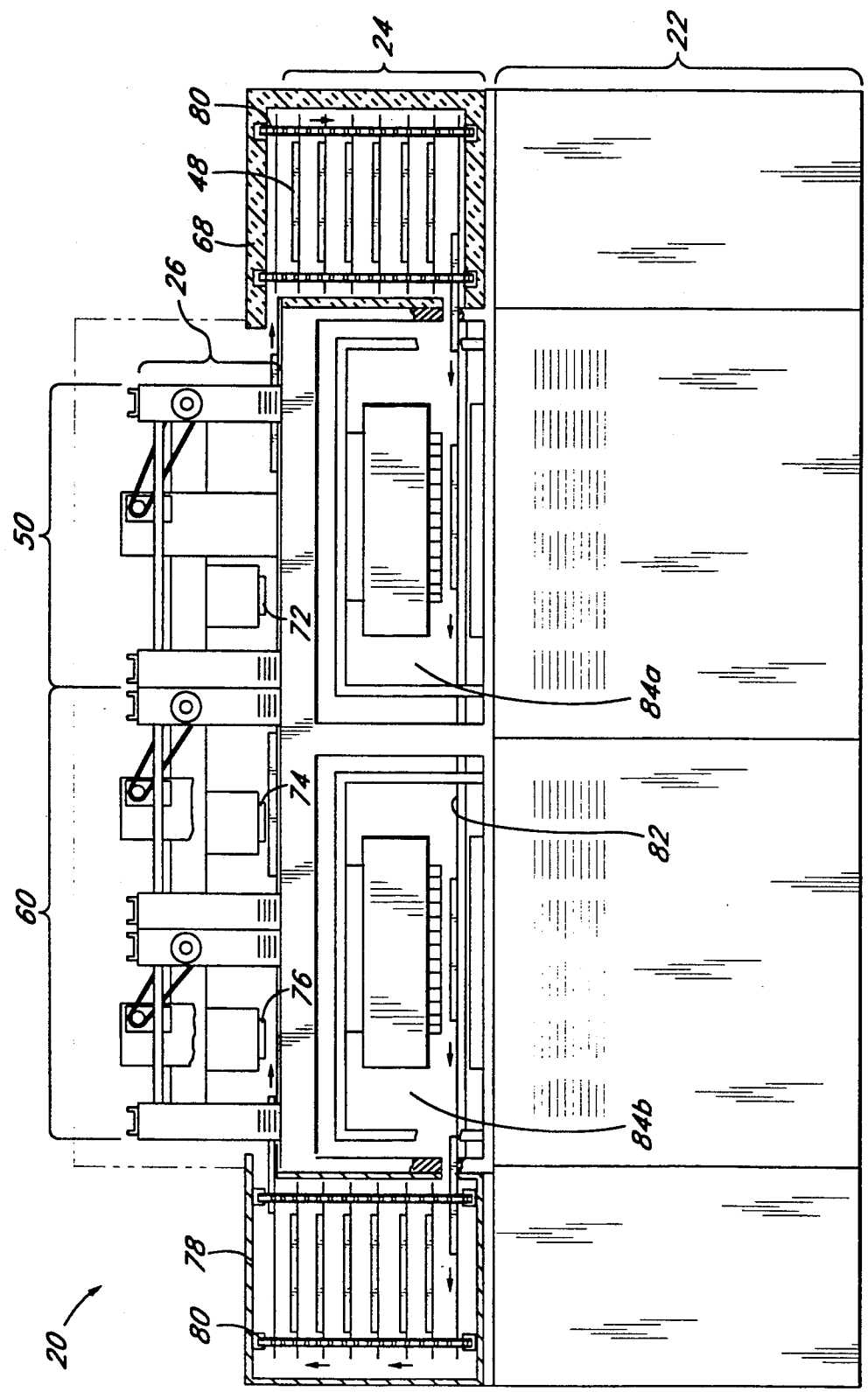
FIG. 4 is a rear elevational view of the automatic test handler of FIG. 3 illustrating primarily the soak chamber, the two test areas, and the exit chamber.
Figure 5:
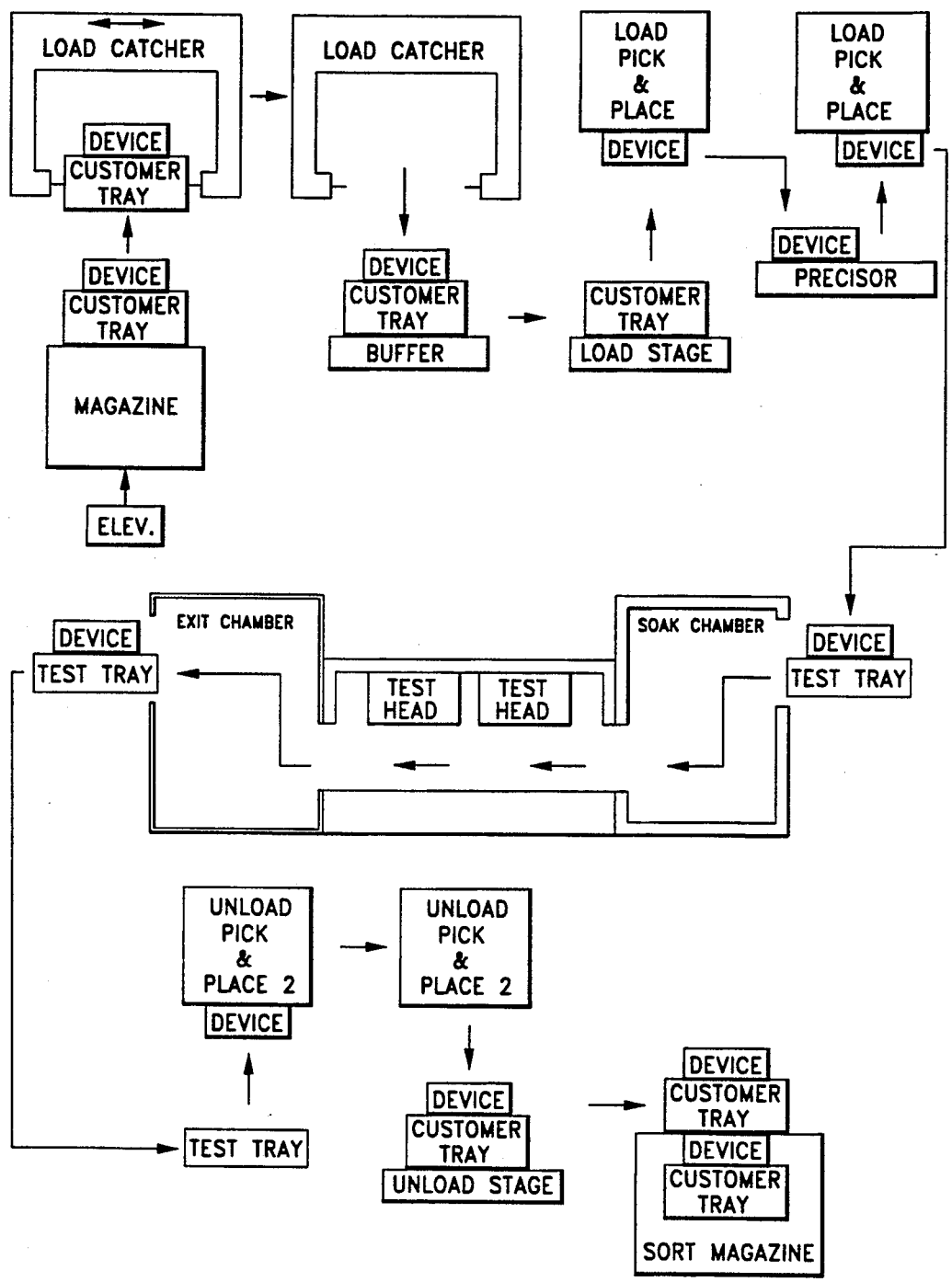
FIG. 5 is a schematic flow diagram illustrating an example of the overall test handler process steps in the automatic test handler of FIG. 3.
Figure 6:
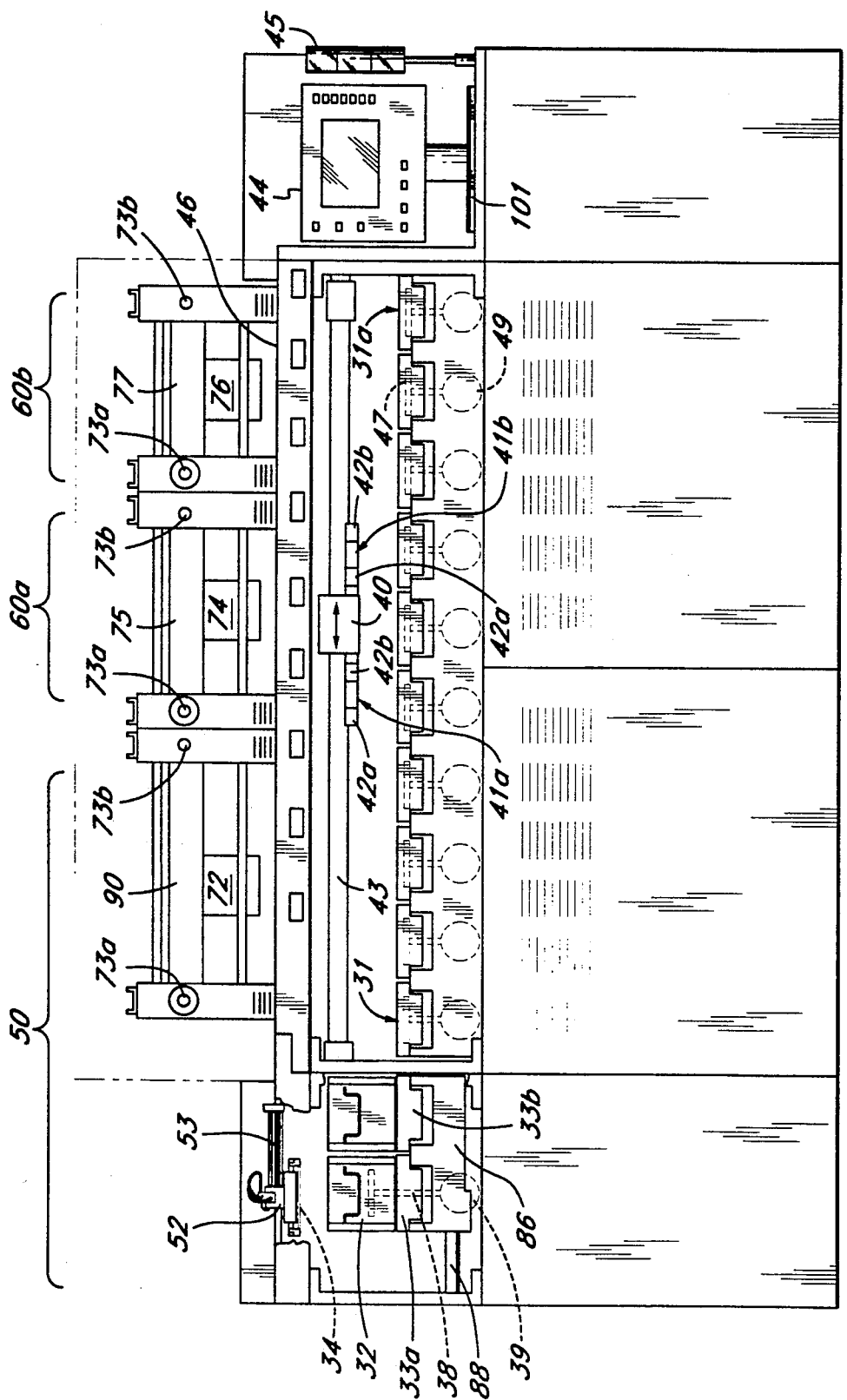
FIG. 6 is a front elevational view of the automatic test handler of FIG. 3 illustrating primarily the customer tray magazine input and output areas.
Figure 7:
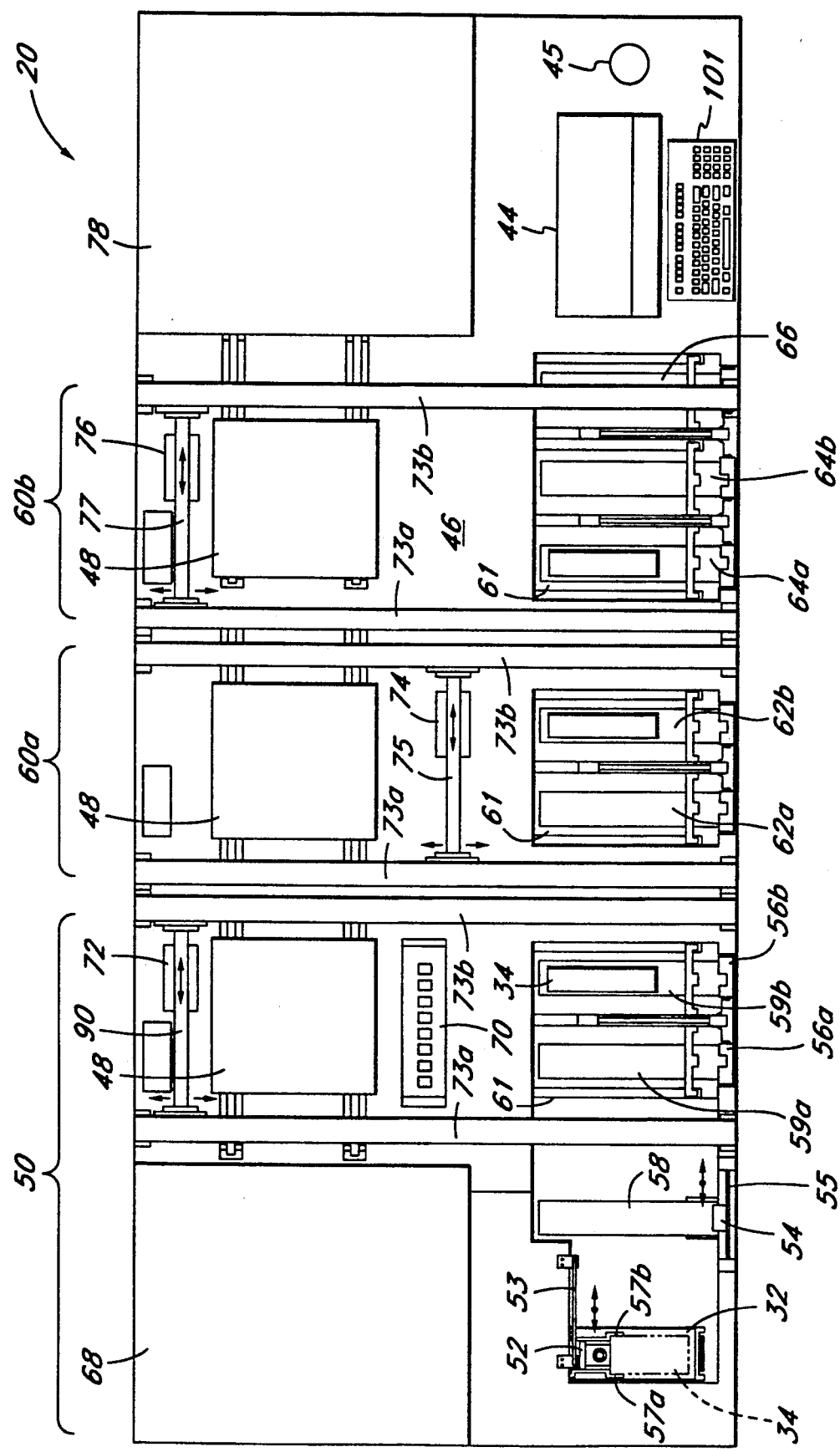
FIG. 7 is a top or plan view of the automatic test handler of FIG. 3 illustrating the loader and unloader sections of the handler, as well as their associated pick and place mechanisms.

To facilitate a better understanding of the present invention, description will first be made to an automatic test handler for which an alarm display system of the present invention would preferably be employed. The perspective view of FIG. 3 illustrates in a somewhat general manner the principal components of the automatic test handler 20 which will incorporate the present invention. The schematic illustration of FIG. 5 illustrates the general test method and sequence followed by the test handler 20 of FIG. 3. Additional detail of the automatic test handler is shown in FIGS. 4, 6 and 7. It will be noted that throughout this description, "left" and "right" designations are used with reference to FIG. 6, which is a front view of the automatic test handler 20.

Although the automatic test handler and method which incorporate the alarm display system of the present invention are described herein in connection with the specific illustrations, the principles of the present invention are not limited to these particular configurations or processes, but can be applied with equal success to electric device test systems of varying configurations utilizing a somewhat different test structure and sequence.

General Description of the Handler

Referring first to FIGS. 3 and 4, the principal components of the test handler 20 which will incorporate the alarm display of the present invention may be described as follows. The handler 20 comprises a lower cabinet 22, a middle portion 24 and an upper portion 26. It will be noted that the lower cabinet 22 is only partially shown in FIG. 3, but completely illustrated in the rear view of FIG. 4. The lower cabinet 22 contains power supply components, electric connections and cables (not shown) which control the function and sequence of the testing operation which occurs primarily in the middle and upper portions 24, 26 of the handler 20.

Referring primarily to FIG. 3, beginning at the front left side of the middle portion 24, there is shown the tray cassette (or alternatively called "magazine") input area 28 which lies immediately adjacent the cassette output area 30 which encompasses the central and right-hand portions of the front of the middle portion 24 of the handler. These cassette input and output areas comprise a number of stations 31 which receive cassettes 32 containing a plurality of stacked customer trays 34 having arrayed thereon the ICs 36 to be tested by the handler 20. Such a customer tray cassette 32 and customer tray 34 is shown in the exploded view of FIG. 3a. For ease of description and illustration, FIG. 3 illustrates only a single customer tray cassette 32 located in the magazine input area 28; however, it will be understood that the various stations of the cassette input and output areas 28 and 30 are each suitable for receiving a similar cassette 32.

Each of the stations 31 of the magazine output area 30 is provided with a customer tray elevator 38 for lifting the customer trays 34 stored within each cassette 32 at the appropriate time. The cassette input area 28 is provided with only a single elevator 38. The two cassettes 32 received by the tray cassette input area 28 contain customer trays 34 having ICs 36 to be tested. The cassette 32 located at each station 31 of the magazine output area 30 receives customer trays 34 of ICs 36 which have already been tested and sorted according to the test results. Thus, in the example shown in FIG. 3, a total of ten stations 31 in the cassette output area 30 are shown. This number of stations would provide, for example, testing of the ICs in accordance with eight different categories, while leaving one station for retest and one station for empty customer trays. However, a wide variety of customer tray input and output configurations are possible in accordance with the principles of the structure of the test handler.

Referring again to the middle portion 24 of the handler 20 shown in FIGS. 3 and 6, a transfer arm 40 having two pairs of tray handlers 42 is illustrated in the cassette output area 30. This transfer arm 40 can move laterally as well as up and down, and interacts with the various sections of the handler 20 to perform the bulk of the customer tray transfer work associated with the handler 20. The movements of this transfer arm 40 are intelligently controlled by means of appropriate software commands from a control module, a display monitor 44 of which is shown on the right-hand side of the middle portion 24 of the handler 20.

The display monitor 44 is used for inputting operational information and data for initiating the device test operation and for monitoring the operation of the automatic test handler including the alarm display in accordance with the present invention. Although not shown, it may be possible and practically useful to provide an additional device such as an operator console separately from the display monitor 44 for programming, controlling, monitoring and displaying the operation of the automatic test handler. A keyboard 101 is accompanied by the display monitor 44 for the operator to key-in various signals including the test information and the command signals for changing alarm screens and alarm menus. An alarm light 45 is attached to the housing of the test handler 20 which emits multiple color light signals, for example, red, green and yellow light for showing the operational situation of the test handler. Preferably, in the normal operating condition, the green light is on when an error is discovered in the test handler, the red light is turned on.

The upper portion 26 of the handler 20 comprises primarily an upper surface 46 where the transfer of the ICs 36 from the customer trays 34 to the test trays 48 and then back again is accomplished. Beginning at the left side of the upper surface 46, the loader section 50 is shown which comprises a tray catcher 52, a customer tray buffer 54 and dual load stages 56a and 56b, arranged side-by-side on the upper surface 46. Immediately to the right of the loader section 50 is the unloader 60, which handles the sorted ICs 36 after they have undergone testing. The unloader 60 comprises two pair of side by side unloader stages, including unload stage 62a and unload stage 62b, located on the left, and unload stage 64a and unload stage 64b, located to the right side of the upper surface. At the extreme right end of the upper surface 46 is an empty customer tray buffer 66 whose purpose is to facilitate reduction of time required to transfer the empty customer trays to the unloader stages 62a, 62b.

Still referring to FIG. 3, a soak chamber 68 is located at the left rear of the middle portion 24 of the handler 20 and extends slightly above the upper surface 46. The soak chamber 68 receives test trays 48 from the upper surface 46. The test tray 48 receives the ICs 36 to be tested from a precisor 70 (i.e., a device for precisely align intervals of the ICs), which in turn receives them from the load stages 56a,b located in the loader section 50. The ICs 36 are transferred from the load stages 56a,b to the precisor 70 and then to the test tray 48 by means of a loader pick and place 72 which translates above the upper surface 46 of the handler 20.

Immediately to the right of the loader pick and place 72 is a pair of unloader pick and place mechanisms, including a left unloader pick and place 74 and a right unloader pick and place 76. The unloader pick and place mechanisms 74, 76 sort the ICs 36, depending upon the test results, and place them on the unload stages 62, 64 for subsequent transfer to the appropriate category cassettes 32 stored in the cassette output area 30 below. The test trays 48 containing the tested ICs 36 arrive at the unloader pick and place mechanisms 74, 76 from an exit chamber (or alternatively referred to as "unsoak chamber") 78 located at the rear right side of the handler 20.

Referring primarily to the rear view of FIG. 4, the soak chamber 68 (now located on the right side of FIG. 4) receives test trays 48 from the upper surface 46 of the handler 20 and gradually lowers them by means of an elevator mechanism 80 to the lower surface 82 of the middle portion 24 of the handler 20. The purpose of the soak chamber 68 is to prepare the ICs 36 for testing by placing them in appropriate temperature. Each test tray 48 is then transferred through two test head chambers 84a,b where each IC device 36 undergoes the desired testing.

In each of the test head chambers 84a,b, the test tray 48 is vertically aligned with respect to test contactors. The test contactors are provided with test signals from the IC tester (not shown). By the vertical movement of vertical drive mechanism (not shown), the test tray 48 descends to the test contactors and in the final stage of the vertical movement, electrical pins of the ICs to be tested make contact with the electrical leads of the test contactors. The test contactors supply test signals to the plurality of ICs at the same time and the resulting signals from the ICs are taken out through the test contactors to the IC tester where the resulting signals are compared to reference signals for evaluation.

The test tray 48 then enters the exit chamber 78 (located at the left of FIG. 4) where it is gradually elevated to the upper surface 46 of the handler 20 while being returned to ambient conditions. In the exit chamber 78, the ICs on the test trays 48 are exposed to the atmospheric temperature so that the temperature of the ICs return to the room temperature (normal temperature at the outside of the test handler). Upon exiting the exit chamber 78, each test tray 48 undergoes IC sorting based on the evaluation in the IC tester by means of the two unloader pick and place mechanisms 74, 76 which are shown adjacent to the loader pick and place mechanism 72.

Figure 8:
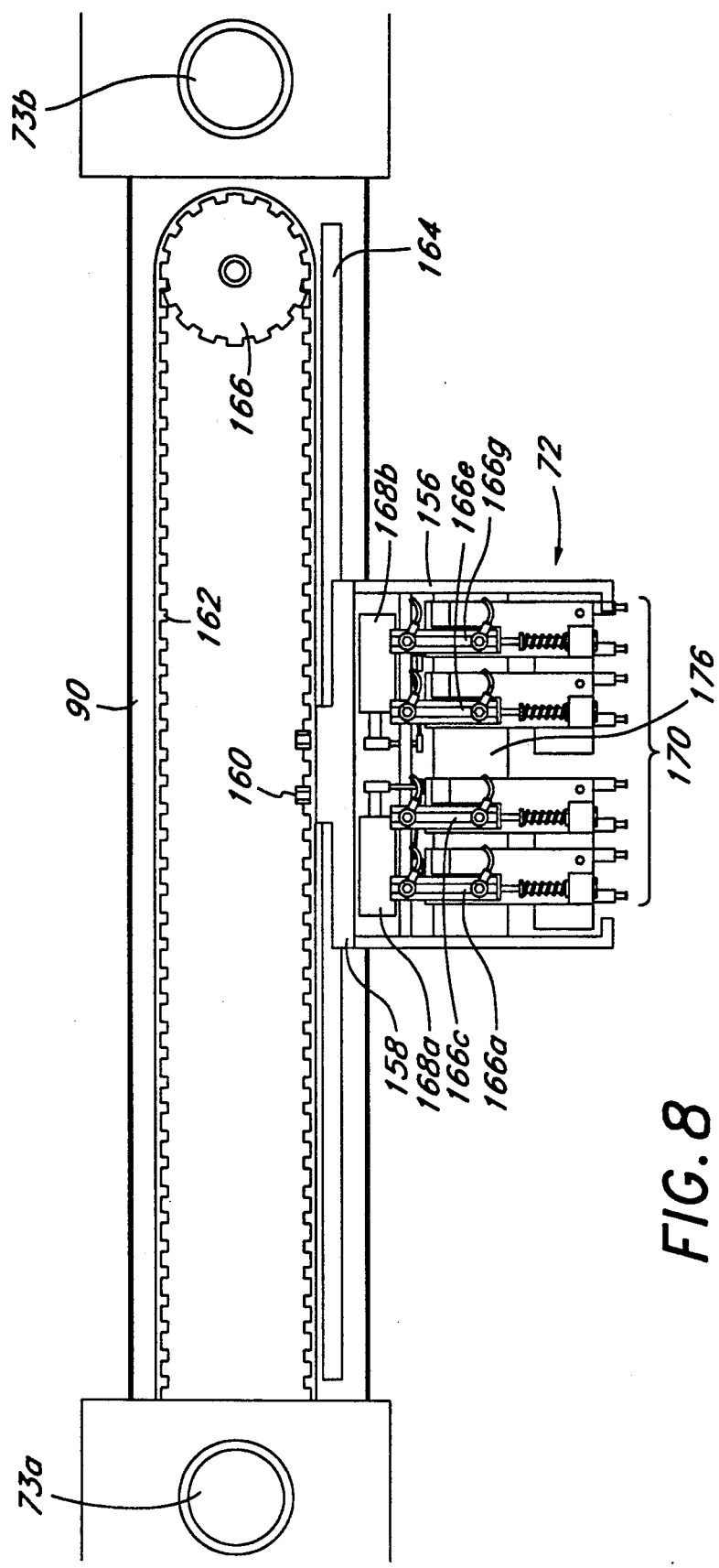
FIG. 8 is a front view of an example of the pick and 15 place and its associated drive mechanism which is preferably employed in the automatic test handler of FIGS. 3-7.

FIG. 8 is a front view of one of the examples of the pick and place in the test handler 20 shown in FIGS. 3, 4, 6 and 7. Although the structure of only the loader pick and place 72 is illustrated in FIG. 8, a substantially similar structure is preferably employed in the unloader pick and places 74 and 76. The loader pick and place 72 is attached to the beam 90 by means of a guide 164 and a belt 162. A holder 158 at the top of a housing 156 of the pick and place 72 is connected to the belt 162 by a connector 160. The belt 162 is horizontally movable by the rotation of a pulley 166. Thus, the pick and place 72 translates laterally in the horizontal plane along the guide 164. The beam 90 moves back and force longitudinally in a horizontal plane along the beams 73a and 73b by a means (not shown) similar to the pulley 166 and the belt 162. The structure of the beams 90, 73a and 73b are described in FIGS. 6 and 7. The pick and place 72 can freely translate within a horizontal plane in a manner similar to an x-y plotter, as is well known in the electronics or mechanical industry.

The pick and place 72 comprises the housing 156, a guide 176, a plurality of suction inlets 170 and a space adjusting mechanism. In the example of FIG. 8, the pick and place 72 includes eight suction inlets 170 so that a maximum of eight devices can be transferred between the customer tray and the test tray at the same time. However, it should be understood that any other arrangements may be employed based on the basic idea shown in FIG. 8. For example, in the test handler of FIG. 3, the loader pick and place 72 includes eight suction inlets whereas the unloader pick and places 74 and 76 have four suction inlets. An air cylinder 166 is provided for each suction inlet 170 for driving the suction inlet up and down to descend proximate to, and raise, the IC devices. The suction power to attract the ICs at the suction inlets is provided by, for example, a vacuum system source which is not shown in the drawings.

The eight suction inlets 170 are alternately and symmetrically assembled to the guide 176. Also, the suction inlets 170 are so attached to the guide 176 that they can slidably movable along with the guide 176 by means of the space adjusting mechanism for adjusting the spacing therebetween. The space adjusting mechanism comprises an air cylinder 168, a pantograph and a variable stopper (not shown). The purpose of the space adjust mechanism is to overcome the differences in the seat spacing between the customer trays and the test trays.

Each of these principal components of the test handler are described in more detail below, and are described in copending and commonly owned patent applications which are hereby incorporated by reference. For example, the total structure and method of operation is the subject of a patent application entitled APPARATUS AND METHOD FOR AUTOMATIC TEST HANDLING, U.S. Ser. No. 803,159, filed Dec. 4, 1991, and the loader/unloader system is the subject of a patent application entitled LOADER AND UNLOADER FOR TEST HANDLER, U.S. Ser. No. 803,154, filed Dec. 4, 1991. Furthermore, the loader and unloader pick and place mechanisms are the subject of an application titled PICK AND PLACE FOR TEST HANDLER, U.S. Ser. No. 801,875, filed Dec. 3, 1991. Moreover, each test head of the dual chamber testing mechanism is the subject of an application entitled CONTACT ASSEMBLY FOR AUTOMATIC TEST HANDLER, U.S. Ser. No. 801,056, filed Dec. 3, 1991.

Although not specifically shown in the drawings, the automatic test handler includes various sensors therethrough to monitor conditions of functional blocks and components in the test handler. For example, a large number of flow sensors for sensing the movement of the electronic devices to be tested, the customer trays and the test trays in the flow of the process are utilized in each position in the handler. In such a flow sensor, as is well known in the art, a light emitting diode and photo diode pair, for example, can be used as a window sensor wherein the light emitting diode emits light signal across the movement path of the devices to be tested so that the light signal be detected by the photo diode every time a gap is caused between the flow of the devices. Other kinds of sensors, such as temperature sensors for monitoring the temperatures of the soak chamber and the exit chamber and a pressure sensor for monitoring an air pressure for use in suction inlets of the pick and places are also used. These sensors are well known in the art, for example, a thermocouple or a Pt sensor (platinum resistance thermometer) are ordinarily used for measuring the temperature.

GENERAL DESCRIPTION OF THE TEST METHOD

The operation of the test handler of FIG. 3 can be generally described in connection with the schematic illustration of FIG. 5. For convenience and ease of description, the reference numerals used in FIG. 5 correspond structurally to similar portions of the present test handler 20 illustrated in FIGS. 3 and 4, which in turn illustrate the steps of the method generally by means of various arrows shown therein.

With respect to FIG. 5, for ease of description, only a single IC "device" is illustrated; although, it will be understood that multiple IC devices can be handled and tested conveniently and efficiency in accordance with the principles of the test handler of FIG. 3. A cassette (or alternatively called "magazine") 32 containing a number of customer trays 34 each having placed thereon IC devices 36 to be tested is first loaded into the tray cassette input area 28. The elevator 38 in the input area 28 pushes up the customer trays 34 until the uppermost customer tray 34 is elevated above the cassette 32. The tray catcher 52 of the load section 50 then drops down and attaches to the customer tray 34 having the IC device 36 to be tested.

The tray catcher 52 then transfers the customer tray 34 to the buffer 54 where it awaits its turn to be received by one of the load stages 56a,b. The transfer arm 40 shown in FIGS. 3 and 6 is used to transfer the customer tray 34 from the buffer 54 to one of the load stages 56a,b. The load pick and place 72, by means of suction, then attaches to the IC device 36 to be tested and places it in the precisor 70 (best shown in FIG. 7) which orients the device 36 precisely with respect to the handler 20 and, more particularly, with respect to the test tray 48. The loader pick and place 72 then picks up the device 36 again from the precisor 70 and places it in its precise location on the test tray 48.

Subsequent to removal of all the ICs 36 to be tested by the loader pick and place 72, empty customer trays are removed from the load stages 56a,b and placed in the empty magazine station 31, preferably at the far right of the cassette output area 30, or on the empty customer tray buffer 66 located at the extreme far right of the unload section 60. The empty customer trays 34 are used for installing the tested ICs depending on the classification determined by the test results. This movement and transfer is accomplished by the transfer arm 40.

The test tray 48 is then transferred into the soak chamber 68 where the device 36 undergoes environmental conditioning. The test tray 48 is then transferred to the dual test head chambers 84a,b where the electronic testing actually occurs. The test tray 48 is then elevated through the exit chamber 78 and is expelled therefrom under ambient conditions. The handler 20 then transfers the test tray 48 to a position where the right unloader pick and place 76 can sort approximately one-half of the tested ICs, placing them in one of the unload stages 64a or 64b. If the IC device 36 in question is not sorted by the right unloader pick and place 76 (which will depend upon the sorting hierarchy and the statistics of particular test results determined by the IC tester and the test handler), the test tray 48 is then shifted to a position under the left unloader pick and place 74 where all of the remaining IC devices are sorted by the unloader pick and place 74 and placed in one of the two unloader stages 62a or 62b.

At each of the unloader stages 62 or 64, a customer tray 34 is waiting to receive the sorted ICs in accordance with the test results and the desired sort categories. When a customer tray 34 is full or is no longer needed for sorting purposes, the transfer arm 40 moves it from the unloader stages 62, 64 and places it in the sort cassette 32 located below the upper surface 46 of the handler 20 in the cassette output area 30.

This process then continues with the now empty test tray 48, leaving its position under the left unloader pick and place 74 and shifting to a position under the loader pick and place 72 to receive more IC devices 36 to be tested.

Alarm Display System

Figure 9:
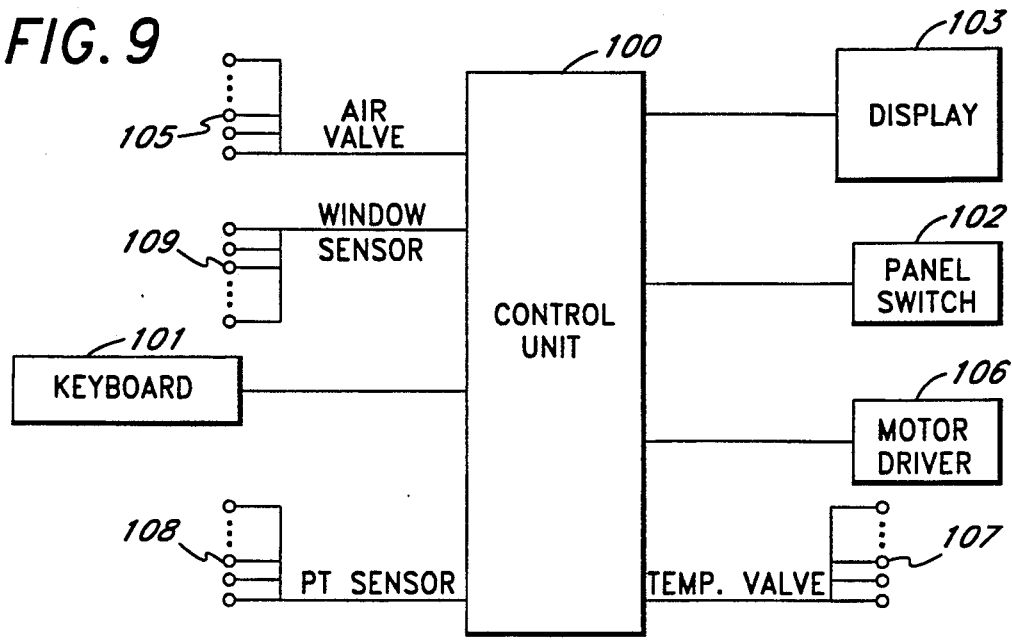
FIG. 9 is a block diagram of a hardware configuration of the alarm display system of the present invention to be utilized in the automatic test handler illustrated in FIGS. 3-7.

FIG. 9 shows a block diagram showing a hardware configuration of the alarm display system of the present invention. The alarm display system comprises a control unit 100 such as a microprocessor unit, a display monitor 44, a plurality of panel switches 102, a key board 101, motor drives 106, air valve drives 105, temperature valve drives 107 to control the flow of nitrogen, sensors 109 and temperature sensors 108.

Any type of microprocessor unit, such as Motorola MC68000 can be used in this invention. Similarly, a general purpose display device including a cathode ray tube, a plasma display panel or a liquid crystal display can be used for the display monitor 44. The motor drives 106 control start and stop timing and speeds of motors employed in various parts of the automatic test handler of FIG. 3. These motors include the drive mechanism for the X-Y movement of the pick and places 72, 74 and 76, the up-down movement of the elevator 38, and other movement including the tray catcher 50 and the transfer arm 40. The air valve drives 105 control the operation of air cylinders installed, for example, in the loader pick and place 72, the unloader pick and places 74 and 76 in FIG. 3, and the test head chambers 84a and 84b in FIG. 4.

The temperature valve drives 107 control an amount of liquid nitrogen, for example, to be supplied to the soak chamber 68 and the exit chamber 78 for controlling the inner temperature of the chambers.

The window sensors 109 typically comprise light emitting diode and photo detector pairs to monitor the flow of moving devices in the automatic test handler, as described above. The temperature sensors 108 typically comprise thermocouples or platinum resistance thermometers (Pt sensors), and are used for measuring internal temperature of the soak chamber 68 and the exit chambers 78.

The combination of the control unit 100, display monitor 44, the key board and the panel switch 102 is a configuration typically included in a computer based system commercially available in the electronics market. As soon as the sensors shown in FIG. 9, provided at the various parts of the test handler, detect an error or jamming of devices or other inadequacies in the test handler, the control unit 100 interprets the detected signals and instructs the alarm display system to generate a warning sound, an alarm light and to change the display to the main alarm screen.

Figure 10:
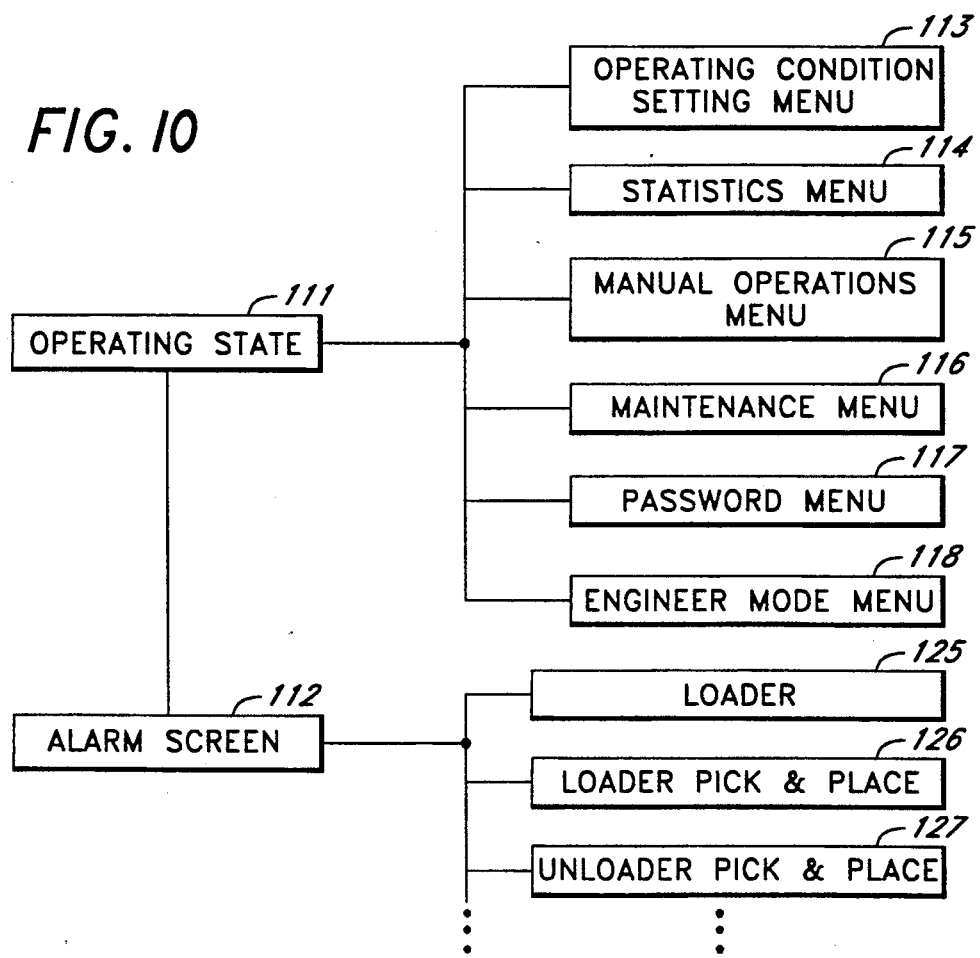
FIG. 10 is a graphic display showing an example of alarm display layers for an operating state function and an alarm display function in the alarm display system in accordance with the present invention.

FIG. 10 is a graphic display showing an example of alarm display layers for the operating state and the alarm screen in accordance with the present invention. Since the alarm display system of the present invention is realized in a general purpose hardware, the display monitor 44 in FIG. 10 is used not only as an alarm display of the test handler but also to as a monitor for setting the various parameters for testing the electric devices and monitoring the overall operation of the test handler 20. Namely, major menu of the display monitor 44 is divided into an operating state 111 and a main alarm screen 112 as illustrated in FIG. 10.

Initially, the alarm display system of the present invention is set to indicate the operating state 111 if no error or jamming occurred in the test handler. As described in more detail later, the operator can input various conditions and parameters for pursuing the device test operation in this state. In a second layer of the operating state, there are a number of graphic displays depending on the menus as illustrated in FIG. 10. Such a second layer of menus include an operating condition setting menu 113, a statistics menu 114, a manual operation menu 115, a maintenance menu 116, a password menu 117 and a engineer mode menu 118. The operating condition menu 113 is used for setting the test parameters such as type of devices to be tested, number of devices to be tested at the same time, temperature in the chambers and so on. Basically, this menu is used for setting the test parameters and data in furtherance to the information setting in the operating state The statistics menu 114 is used for statistically analyzing the test results, for example, distribution of defects versus temperature or numbers of jamming or errors encountered during the test. The manual operation menu 113 is used for manually operating mechanical parts such as air cylinders, pulse motors, and the like, to check the mechanical movement of the test handler. The maintenance menu 116 is used for adjustment and calibration of mechanical parts, voltage levels of the window sensors, sensing levels in the temperature sensors, and other sensors at the start of the handler operation or at predetermined intervals. The password menu 117 and the engineer menu 118 are for determining the operator level or authority to get into the test system to change the test conditions, parameters and the like. Since the alarm display of the present invention relates more to the main alarm screen 112 and its detailed manus, no further description will be made regarding the above identified each menu.

At the moment of detecting an error in the handler, the alarm display system changes the alarm light 45 from the green to red and generates a warning sound such as a beep, and changes the display monitor 102 to the main alarm screen 112. As described in more detail later, the main alarm screen shows in graphic form the overall functional blocks of the test handler with corresponding blinking indicators. In the second layer of the alarm screen, there are a proper number of graphic displays depending on the number of functional blocks in the test handler to show more detailed views of the functional blocks in the test handler to thereby identify the position of the errors or jamming. Such a detailed menu includes, for example, a loader 125, a loader pick and place 126 and an unloader pick and place 127 as shown in FIG. 9. Other menus are also possible depending on the possible functional blocks to be provided in the test handler 20. The detailed description of the each menu in accordance with the alarm display will be made in more detail below with respect to FIGS. 13-15.

Figure 11:
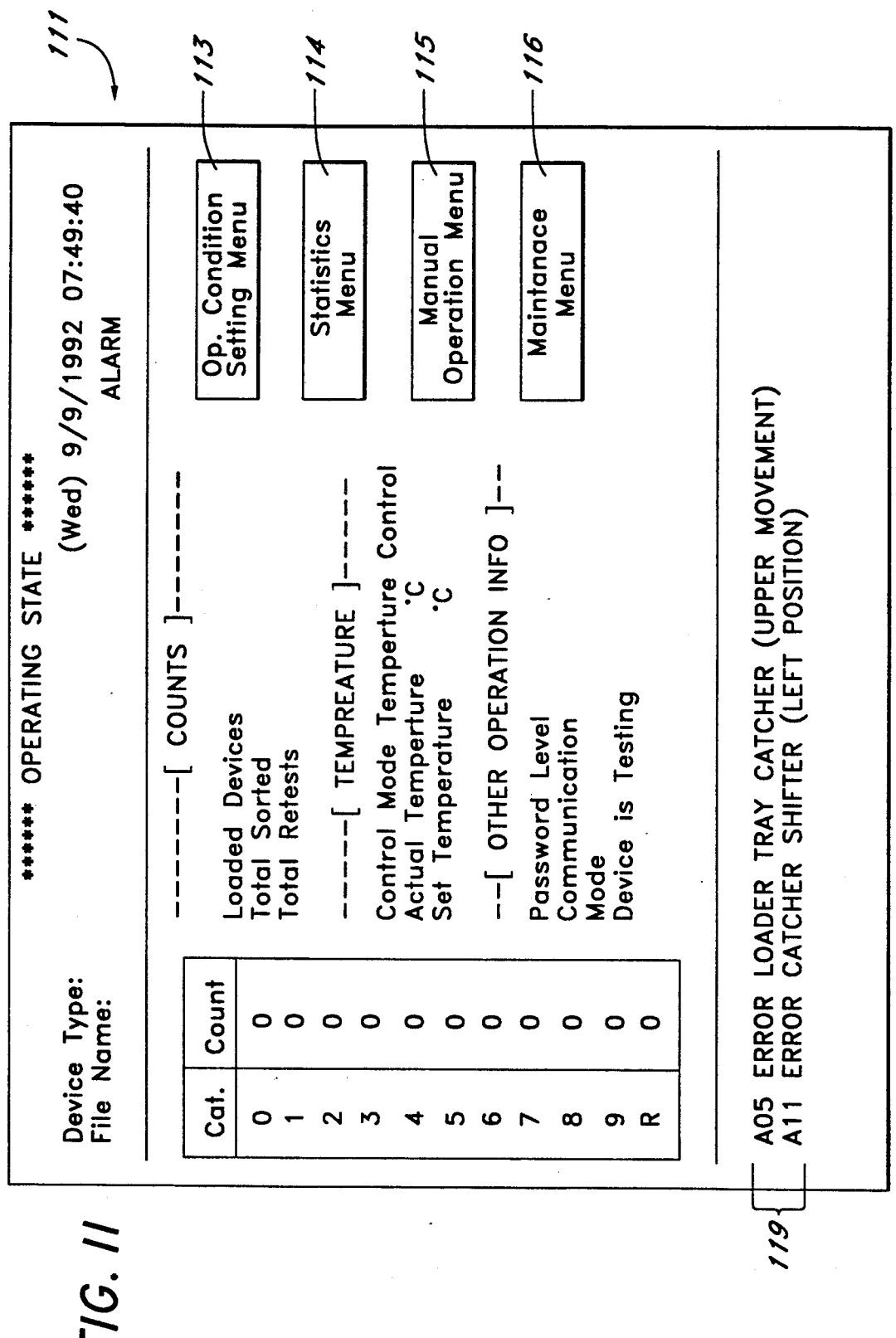
FIG. 11 is an example of screen display of the alarm display system of the present invention showing the operating state of the automatic test handler when there is no errors happened in the test handler.

FIG. 11 is an example of screen display of the alarm display system of the present invention showing the operating state of the automatic test handler when no error has been detected in the test handler. In the operating state screen 111, basic information regarding the test operation by the automatic test handler 20 is indicated, including a date of test, kinds of electric devices to be tested, number of loaded devices, number of sorting paths, and test temperature. These parameters are set by the operator prior to the initiation of the device test. The right hand side of the screen shows a display menu of detailed layers of operation for setting operating conditions as illustrated in FIG. 10. The operator of the test handler can select the detailed display menu by moving the arrow key on the key board 101, as is well known in the art.

The operating state screen will be set even where there is an error in the handler by pressing the predetermined key. For example, if the alarm display system of the present invention is in an alarm screen state (which will be described in more detail later) caused by the detection of an error, the operator can return to the operating state screen by pressing a function key F1 on the keyboard 101. In that case, as shown in the upper right and the bottom parts of the display, information regarding the errors in the test handler is displayed as in FIG. 11. Similarly, the operator can go back to the alarm screen state by executing a function key F3 on the keyboard 101.

Figure 12:
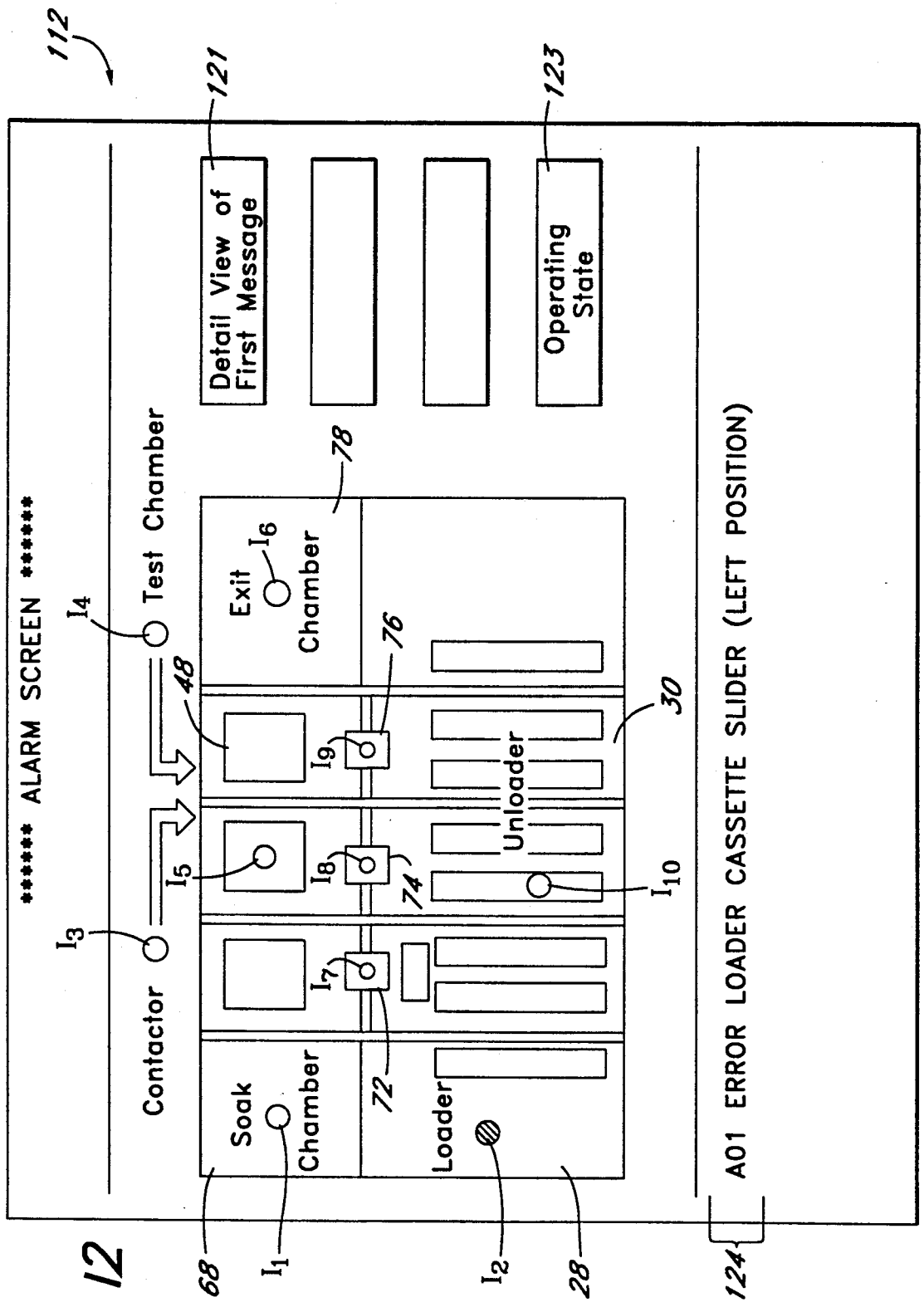
FIG. 12 is an example of screen display of the alarm display system of the present invention showing the main alarm screen which has an illustration of overall functional blocks in the test handler and indicators for corresponding functional blocks to indicate the existence of errors in the automatic test handler.

When an error or jamming in the test handler occurs, the alarm display system of the present invention will automatically change its state from the operating state of FIG. 10 to the main alarm screen. FIG. 12 is an example of a screen display of the alarm display system of the present invention showing the main alarm screen. The alarm display screen has an illustration of overall functional blocks in the test handler and indicators for corresponding functional blocks to indicate one or more functional blocks in the test handler involving the errors. Such functional blocks include the loader 28 with the indicator I2, the unloader 30 with the indicator I10, the soak chamber 68 with the indicator I1, the tray transfer 48 with the indicator I5, the exit chamber 78 with the indicator I6, the loader pick and place 72 with the indicator I7, the unloader pick and places 74, 76 with the indicators I8, I9, respectively, the contactor with indicator I3, and the test chamber with indicator I4.

As soon as one or more of the sensors shown in FIG. 9 provided at the various parts of the test handler detect an error or jamming of devices or other inadequacies in the test handler, the control unit 100 instructs the alarm display system to change the alarm light to red and to generate a warning sound to notify the operator or any other person that the system has detected an error. The control unit 100 also instructs the alarm system to convert the display to the main alarm screen. The graphic display in the main alarm screen is similar to the actual mechanical layout in the automatic test handler 20 of FIG. 3 so that the user or the maintenance person can tell from the display which functional block is wrong. In the example of FIG. 12, it is assumed that the error is detected at the loader 28 and thus the indicator I2 flickers until the error is cleared. An error message A01 is also displayed in the message display 124 at the bottom of the screen 112. The error massage A01 in this exemplary case reads "ERROR LOADER CASSETTE SLIDER (LEFT POSITION)", which means that an error exists in a left side of loader. Therefore, the error message A01 gives the user more detailed information regarding the location and type of errors than one can tell from the upper screen which merely shows the functional block (the loader in this example).

The main alarm screen 112 shows, at the right hand side, a second layer of menus including a detail view of the first message 121 and the operating state 123. If the cursor is set to one of these menus by the keyboard 101 and then the function key F1 is executed, the display screen will change to the designated screen. Thus, if the operating state menu is hit, the display screen will change to the operating screen as shown in FIG. 11. One of the features of the present invention resides in the multiple layers of error display by hitting the detail view of the first message 121 to go into more details of the error caused in the test handler. If the detail view of the first message 121 is selected, the display screen will change into the screen of the functional block which is designated by the first error message A01 at the bottom of the main alarm screen 112, and thus, the loader 28 in this example. If there is a second error message in the bottom of the main alarm screen, the main alarm screen also displays an additional menu indicator similar to the indicator 121 which will indicate "Detail View of Second Message" for detailed view of the second message.

Figure 13:
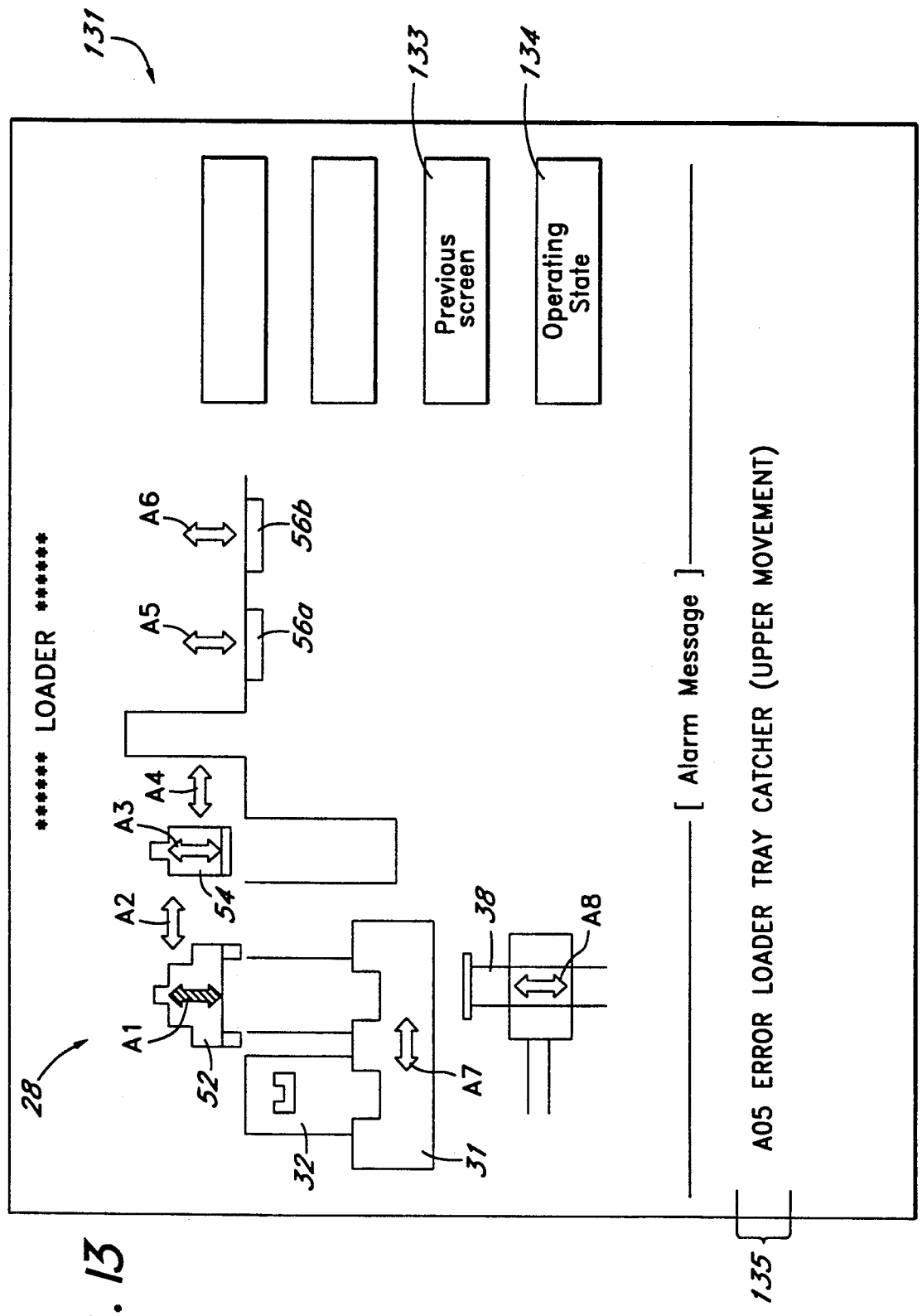
FIG. 13 is an example of screen display of the detailed view of the loader section in the test handler which graphically shows each component and a corresponding blinking indicator included in the loader section.

An example of such a detailed view regarding the loader message is shown in the screen display of FIG. 13 which graphically indicates the detailed view of the loader section in the test handler with each component in the loader section and the corresponding blinking indicator. In the screen display, there is shown a graphic illustration which symbolizes the functional elements in the loader section 28 in more detail to show which functional elements suffering from the error or jamming. Namely, the graphic display 131 of FIG. 13 shows a station 31, a magazine 32, a tray catcher 52, an elevator 38, a buffer 54 and load stages 56a, 56b, all of which correspond to the functional components by the same names and reference numerals described above with respect to FIGS. 3-7. In the example of FIG. 13, the blinking indicators comprise, for example, double arrows A1-A8 to show the user of the test handler more detailed information regarding the error, i.e., the position or the functional component which encounters an error. Each of the arrows A1-A8 is capable of blinking with predetermined time intervals by receiving an instruction from the control unit 100 of FIG. 9 when there is an error in the corresponding functional element. Also, in this example, the arrows A1-A8 are arranged to show the direction of movement of the corresponding functional elements.

At the lower part of the graphic display 131, a message column 135 is provided to show an alarm message indicating the position and type of the error present in the test handler. In this example, the alarm message reads "A05 ERROR LOADER TRAY CATCHER (UPPER MOVEMENT)", which means that an error in the tray catcher 52 in the tray set of the loader 28 in the test handler 20 has occurred in its upper movement. At the right-hand side of the display 131, menu indicators 133 and 134 are provided to indicate the next menus to be selected by defining the corresponding indicators. The indicator 133 designates the previous screen, which is the main alarm screen of FIG. 12, and the indicator 134 designates the operating state screen which is shown in FIG. 11. The user of the alarm display system of the present invention can define and execute one of the menus on the menu indicators by using the arrow keys to position the marker on the screen to the menu indicators 133 or 134 and then hitting the function key F1 in the keyboard 101, as is well known in the art.

Figure 14:
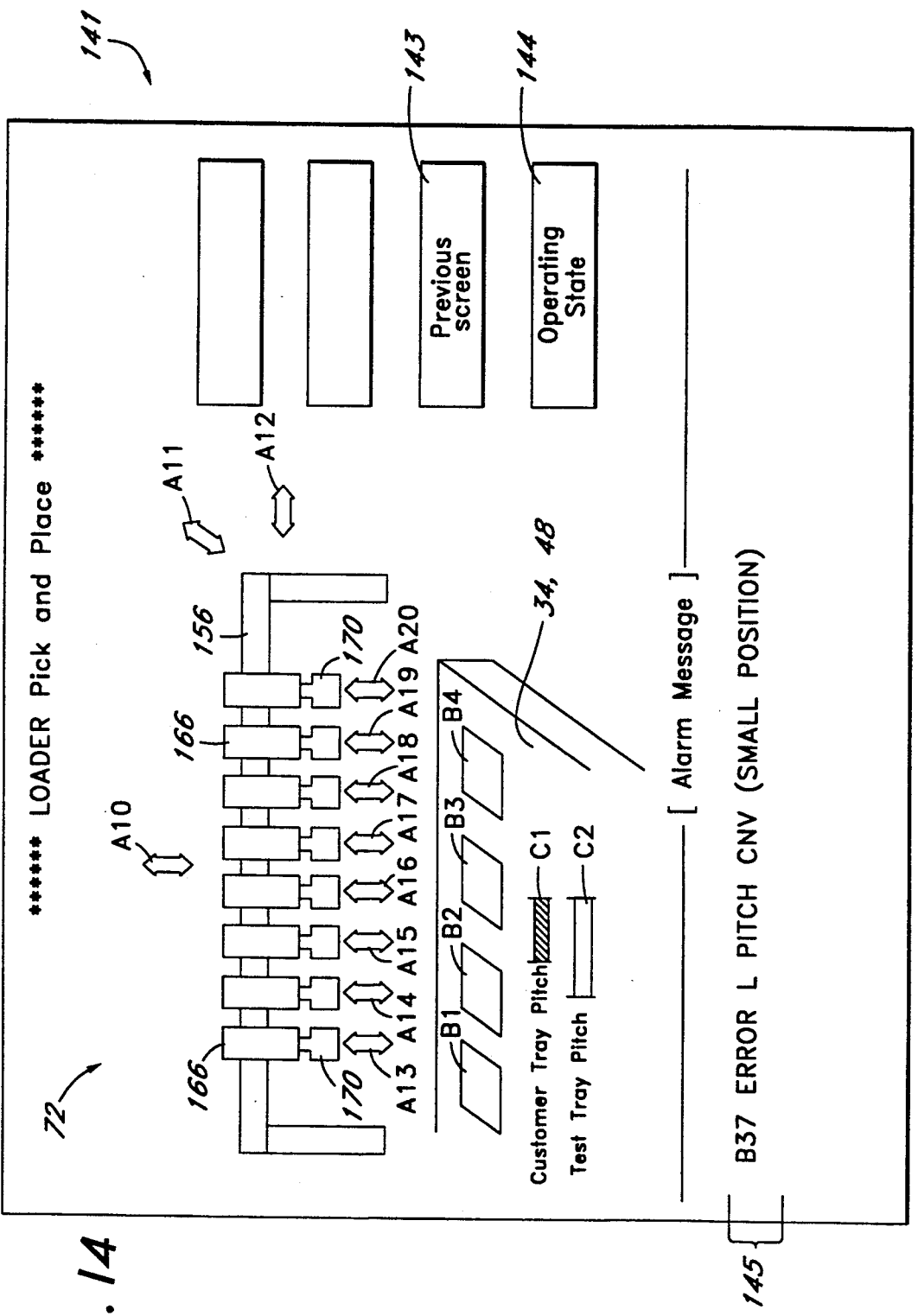
FIG. 14 is an example of a screen display of the detailed view of the loader pick and place section in the test handler which graphically shows each component and a corresponding blinking indicator included in the loader pick and place section.

FIG. 14 illustrates an example of screen display 141 of the detailed view of the loader pick and place section 72 in the test handler 20. The screen display 141 graphically shows functional components included in the loader pick and place section 72 and the corresponding blinking indicators. The graphic display 141 shows an illustration which symbolizes the functional elements in the loader pick and place 72 in more detail than that of the main alarms screen 112 in FIG. 12 to show more precisely which of the elements is suffering from the error or jamming. Namely, the graphic display 141 of FIG. 14 shows a plurality of suction inlets 170 with air cylinders 166 on a housing 156 which correspond to the functional components of the identical names used in the pick and place shown in FIG. 8. In the example of FIG. 14, the blinking indicators A10-20 comprise double arrows arranged to show the error position of the components of loader pick and place 72 in more detail similar to the example of FIG. 13. Each of the arrows A1-A8 is capable of blinking by receiving an instruction from the control unit 100 of FIG. 9 when there is an error in the corresponding functional elements occurs. Also, in this example, the arrows A1-A8 are arranged to show the direction of movement of the corresponding functional elements.

The graphic display of FIG. 14 also illustrates a tray which designates either the customer tray 34 or the test tray 48 shown in FIGS. 3 and 4. Alarm indicators B1-B4 are illustrated in the tray 34, 48 which represent, for example, the device seats 35 on the customer tray of FIG. 3a or the seats on the test tray 48. The pick and place 72 in the automatic test handler 20 can adjust the spacing interval between the suction inlets 170 for matching with the spacing difference between the customer trays and the test trays as described with respect to FIG. 8. Alarm indicators C1 and C2 indicate such spacing intervals. The indicator C1 designates the customer tray pitch and the indicator C2 designates the machine tray (test tray) pitch. The alarm indicators B1-B4 and C1-C2 can flicker when an error occurs in the corresponding functional elements. In this example, the indicator C2 is blinking to show that an error in the adjustment of test tray pitch has occurred.

At the lower part of the graphic display 141, a message column 145 is provided to show an alarm message in a sentence form indicating the position and type of the error corresponding to the blinking of the indicators A10-A20, B1-B4, C1 and C2, shown in the upper part of the display 141. In this example, the alarm message reads "B37 ERROR L PITCH CNV (SMALL POSITION)", to indicate an error in the conversion of the pitch (spacing adjustment between the seats) for the customer tray (which has a smaller seat spacing than that of the test tray) in the loader pick and place 72. At the right-hand side of the display 141, menu indicators 143 and 144 are provided to indicate the next menus to be selected by defining the corresponding indicators as in the same manner in FIG. 13. The indicator 143 designates the previous screen, which is the main alarm screen of FIG. 12, and the indicator 144 designates the operating state screen which is shown in FIG. 11.

Figure 15:
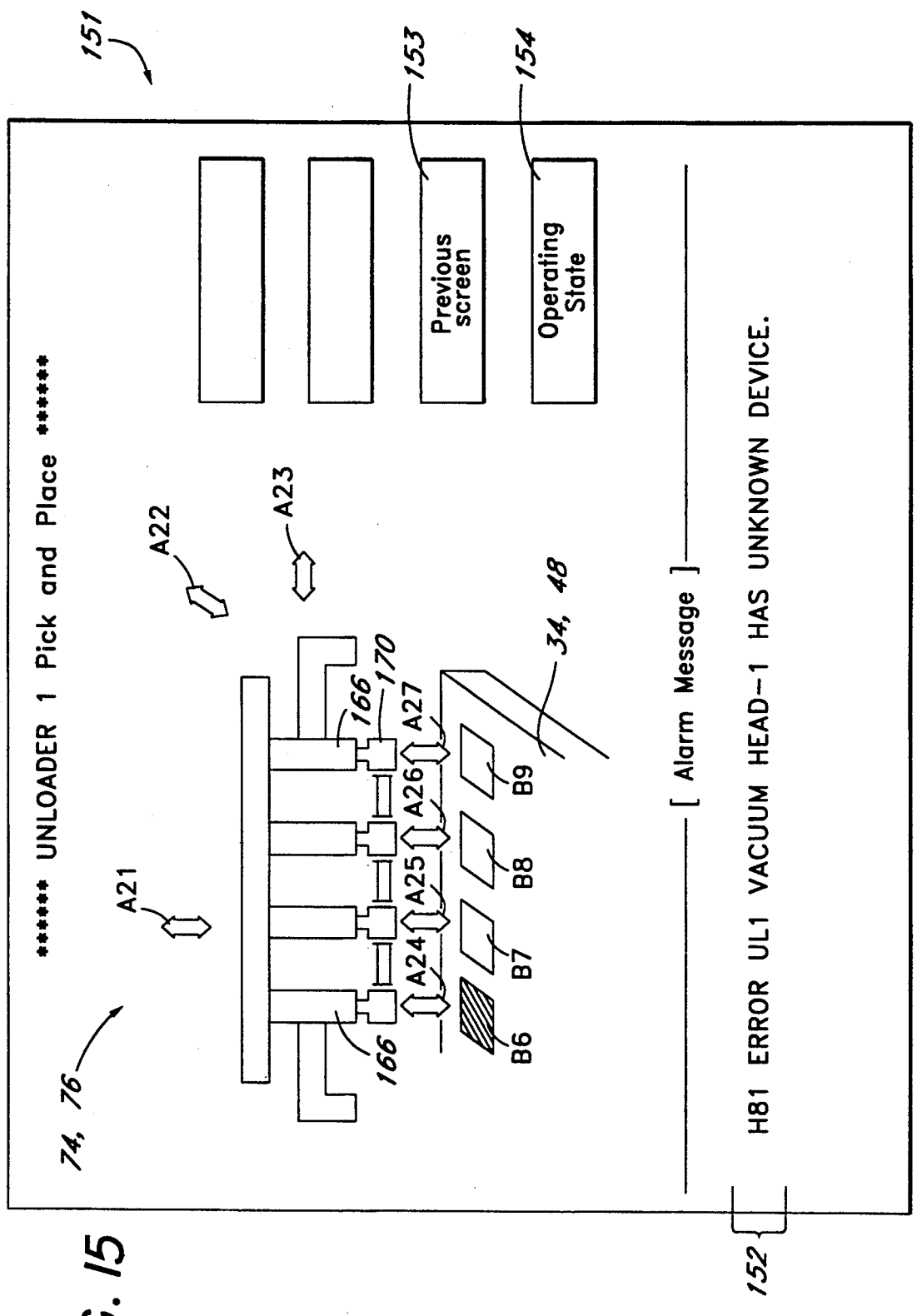
FIG. 15 is an example of screen display of the detailed view of the unloader pick and place section in the test handler which is graphically described to show each component and blinking indicator included in the unloader pick and place section.

FIG. 15 illustrates an example of a screen display 151 of the detailed view of the unloader pick and place section 74 (or 76) in the test handler 20 which graphically shows the functional components included in the unloader pick and place section 74 and the corresponding blinking indicators. The graphic display 151 shows an illustration which symbolizes the functional elements in the unloader pick and place 74 in more detail than that of the main alarms screen 112 of FIG. 12 to show more precisely which of the elements is has the error or is jammed. As described with respect to FIG. 8, the unloader pick and places 74, 76 have essentially the same structure and mechanism with the loader pick and place 72, although the number of suction inlets and their corresponding drive mechanism can arbitrarily be selected.

In this example, the unloader pick and place 74 has four suction inlets 170 for attracting and releasing the electronic devices (ICs) between the costumer trays 34 and the test trays 48. Namely, similar to the example of FIG. 14, the graphic display 151 of FIG. 15 shows four suction inlets 170 with corresponding air cylinders 166 on the housing 156. A tray is also illustrated which designates either the customer tray 34 or the test tray 48 shown in FIGS. 3 and 4 in the same way of FIG. 14. In the example of FIG. 15, the blinking indicators A21-A27 comprise double arrows, and alarm indicators B6-B9 are arranged to show the position and type of error in the components of unloader pick and place 74. The alarm indicators B6-B9 designate the device seats in either the customer tray 34 or the test trays 48. Each of the indicators A1-A8 and B6-B9 is capable of blinking by receiving an instruction from the control unit 100 of FIG. 10 when there is an error in the corresponding functional elements occurs. In this example, the indicator B6 is blinking to show that an error in the kind device to be tested in the seat of the tray has occurred.

At the lower part of the graphic display 151, a message column 152 is provided to show an alarm message in a sentence form indicating the position and type of the error corresponding to the blinking shown in the upper part of the display 151. In this example, the alarm message reads "H81 ERROR UL1 VACUUM HEAD-1 HAS UNKNOWN DEVICE", which means that there is a wrong device in the device seat referenced by the indicator B6 of the trays 34 or 48. At the right-hand side of the display 151, menu indicators 153 and 154 are provided to indicate the further menus to be accessible. The menu indicators 153 and 154 are identical to the menu indicators in FIGS. 13 and 14.

Flow Diagram

Figure 16:
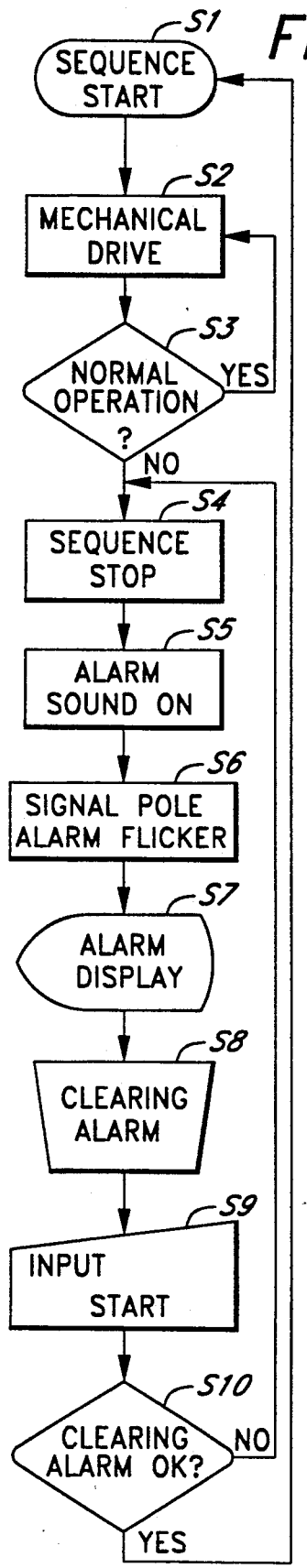
FIG. 16 is a schematic flowchart of the overall operation of the alarm display system of the present invention showing the sequence of the test operation and alarm display operation.

In the preferred embodiment of the present invention, the procedure of the invention is implemented as an algorithm in the control unit 100 of FIG. 9. FIG. 16 is an exemplary flowchart of the algorithm for overall operation of the alarm display system of the present invention showing the sequence of the test operation and alarm display operation.

In a first step S1, the algorithm for operating the test handler 20 is initiated by, for example, executing a start command by hitting a predetermined start key on the key board 101. It is also possible to initiate the operation of the test handler 20 by an instruction from the master test system (IC tester). After the start of the operation, the IC tester provides test signals to the test head chambers 84a,b shown in FIG. 4 to supply the test signals to the IC devices to be tested and to receive resulting signals from the IC devices. After the sequence start in the step S1, the algorithm proceeds to a step S2 wherein the test handler performs the handling operation as describe with reference to FIGS. 3-7.

During this step, customer trays 34 are transferred from the magazines 32 to the load stages 56a,b by means of the tray catcher 52 and the transfer arm 40, and the IC devices are transferred from the customer tray 34 to the test trays 48 by the loader pick and place 72 so that the IC devices are sent to the test chambers 84a,b through the soak chamber 68. After the test in the test chambers 84a,b, the tested ICs are sent back through the exit chamber 78 to the unloader pick and places 74,76 to be sorted depending on the test results. The customer trays with the tested ICs thus sorted by the unloader pick and place are further classified into the cassettes 32 for the shipment.

In a step S3, the above operation in the test handler 20 is monitored by the various types of sensors shown in FIG. 9 to determine whether the operation in the test handler is normal or not. If the test results in the step S3 are affirmative, namely, no error has occurred in the test handler, the algorithm goes back to the step S2. Therefore, as long as the test handler operates without any errors, the alarm system of the present invention repeats the steps S2 and S3 until the operation of the handler comes to an end. During these states, the display monitor 44 shows the operating state screen of FIG. 11. If the test result in the step S3 is negative, and thus, the control unit 100 determines that there is an error in the test handler, the algorithm proceeds to a step S4 wherein the test sequence is stopped.

The control unit 100 sets the next three steps S5-S7 in series or simultaneously. Namely, the steps S5-S7 are not necessarily in the order shown in FIG. 16 but can be proceeded in any order or at the same time. For convenience of explanation, the description will be made from the step S5 to the step S7 in series. In the step S5, the alarm display system emits an alarm sound to notify the operator of the existence of an error or other inadequacies in the test handler 20. The alarm sound will be generated by any means including a conventional buzzer or a synthesized sound generator. At the same time, in the step S6, the alarm light 45 on the housing of the test handler 20 starts to emit the red light, either flickering or without flickering, to notify the operator or any other person of the occurrence of the error. The alarm light is especially effective when any persons are not within reach of the alarm sound. Also at the same time, in a step S7, the alarm display system of the present invention is switched from the operating state screen to the main alarm screen of FIG. 12. As described above with reference to FIG. 12, the main alarm screen also includes the indicators which flicker if the corresponding functional blocks are involved in an error. The procedures of monitoring the detailed view of the error is described in more detail with respect to FIG. 17.

The algorithm of the alarm display system of the present invention proceeds to a step S8 wherein the operator or a maintenance person examines and corrects the error. Alternatively, the maintenance can be preferably made after examining the detailed view of the alarm screens as described in FIGS. 13-15, the algorithm of which is described with respect to FIG. 17 later. After correcting the error in the step S8, the operator inputs a start command in a step S9 so that the procedure moves to a step S10 wherein the alarm display system of the present invention determines whether all the errors in the test handler 20 have been cleared. If the test result is affirmative, the algorithm goes back to the step S1 wherein the test sequence of the handler is initiated for testing the IC devices. If the test result in the step S9 is negative, the algorithm goes back to the step S4 wherein the test sequence is stopped and proceeds to the alarm sound and alarm light generation steps S5, S6, and the main alarm screen step S7. Therefore, until all the errors in the test handler are completely corrected, the algorithm repeats the steps S4-S10.

Figure 17:
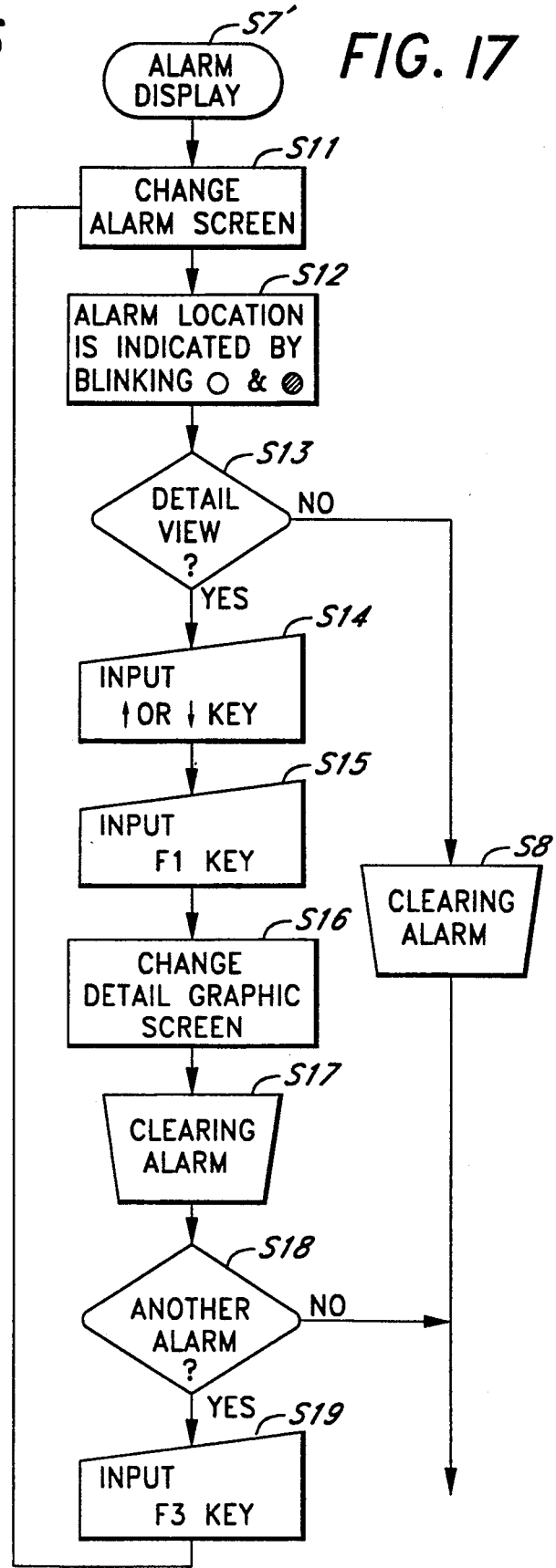
FIG. 17 is a schematic flowchart of the operation of the alarm display system of the present invention showing, especially, the alarm display sequence involving the interaction of the main alarm screen and the detailed view alarm screen, and clearing an error in the alarm sequence.

FIG. 17 shows a flowchart of the operation of the alarm display system of the present invention including steps for interacting the main alarm screen and the detailed view screen as described with reference to FIGS. 12-15. The algorithm of FIG. 17 is a more detailed form of procedure which corresponds to the steps S7-S9 in the flowchart of FIG. 16. When there is an error in the test handler, the algorithm of the alarm display operation starts in a step S7' which is a start step of the flowchart of FIG. 17. In a step S11, the operating state screen 111 in the display monitor 44 is replaced with the main alarm screen 112 of FIG. 12. In the main alarm screen 112, in a step S12, the error location is indicated by blinking of the indicators I5-I10 which correspond to the functional blocks in the test handler 20. Therefore, the combination of the steps S7' and the steps 11 and 12 in FIG. 17 is identical to the step S7 in FIG. 16. As described in detail, the main alarm screen also display the menu for detailed view of the functional blocks which involved in the error.

Next, the procedure moves to a step S13 wherein the alarm display system of the present invention inquires the user whether the detailed view of the alarm location should be monitored. If the answer is NO, the algorithm moves to the step S8 wherein the operator or a maintenance person examines and corrects the error. After correcting the error in the step S8, the procedures moves to the step S9 as in FIG. 16 wherein the operator inputs the start command for determining whether there exists other error in the test handler. If the operator wants to monitor the detailed view of the error, in a step S14, the operator hits an arrow key on the keyboard 101 to set the marker on the screen to the menu 121 ("Detailed View for First Message"). Then, in a step S15, the operator executes the function key F1 on the keyboard 101.

In a step S16, the display will change to the detailed screen as shown in FIGS. 13-15 which shows the error position and the type of error in more detail in forms of the arrow indicators and other indicators. In a step S17, the operator or the maintenance person works on clearing the error in the designated position by the indicators in FIGS. 13-15 in the test handle. In a next step S18, it is determined whether there is another alarm shown in the alarm display system. If there is no other alarm, the algorithm moves forward to the step S9 for the start of next error search procedure. On the other hand, if an alarm remains in the alarm display system, the operator inputs F3 key to go back to the main alarm screen 112 to find out in which functional block suffers an error. Therefore, the procedure from the step S11–S19 repeats until all the errors are cleared.

As set forth above, according to the present invention, the alarm display system can identify an error position and the type of error accurately in a short period of time. Although only two layers of alarm display has been described above, it is possible to provide further detailed display layers in accordance with the inventive features of the present invention.

The alarm display system of the present invention represents a substantial improvement in IC testing and handling.

What is claimed is:

1. An alarm display system for use in an automatic test handler for testing a plurality of electronic devices horizontally arranged on trays, said alarm display system comprising:
   a plurality of sensors arranged in each position of said automatic test handler for sensing parameters including a flow of said electronic devices on said trays in said test handler;
   a single display for notifying an operator of the occurrence of error in said automatic test handler and displaying a main alarm screen for showing a general position of said error, said main alarm screen including a first menu selection indication for selectively and sequentially displaying on said display (i) an operating state screen, or (ii) a first detailed view alarm screen, said first detailed view alarm screen including a second menu selection indication for selectively and sequentially displaying on said display (i) a second detailed view alarm screen, (ii) said main alarm screen, or (iii) said operating state screen, each of said detailed view alarm screens showing a specific position of said error in said test handler, said alarm screens including position indicators which flicker to indicate said positions and said display showing an operating state screen for indicating information on the test conditions of said automatic test handler when no error exists in said automatic test handler;
   a control unit for controlling overall procedures of testing operation in said test handler, said control unit detecting said error in said test handler from signals provided from said sensors and informing said display of said general and specific positions of said error.

2. The alarm display system of claim 1, wherein said alarm display system further includes means for emitting an alarm sound and alarm light when said error is detected in said test handler.

3. The alarm display system of claim 1, wherein said sensors include a window sensor for monitoring and sensing the movement of said electronic devices to be tested, a temperature sensor for monitoring temperature in a temperature chamber, and a pressure sensor for sensing level of air pressure in a compressed air system in the test handler.

4. The alarm display system of claim 1, wherein said display normally shows said operating state screen for said test operation when no error exists in said tester and automatically moves to said main alarm screen if there is an error based on the instruction from said control unit.

5. The alarm display system of claim 1, wherein said display is a general purpose display device including a cathode ray tube, a plasma display panel and a liquid crystal display.

6. The alarm display system of claim 1, wherein said main alarm screen shows an overall positional diagram which graphically indicates the functional blocks of said test handler, said main alarm screen flickering said position indicator illustrated in said graphic display which corresponds to the functional block of said test handler wherein the error exists.

7. The alarm display system of claim 1, wherein said detailed view alarm screen shows each positional diagram corresponding to said functional block which graphically indicates the components in said functional blocks, said detailed view alarm screen flickering said position indicator illustrated in said graphic display which corresponds to the component of said functional block wherein the error exists.

8. The alarm display system of claim 1, wherein each of said operating state screen and said main alarm screen and said detailed view alarm screen includes menu indicators for directly changing said screens therebetween.

9. The alarm display system of claim 1, wherein each of said operating state screen and said main alarm screen and said detailed view alarm screen includes an error message in a written form to show the type of said errors in said test handler.

10. An automatic test system for testing integrated circuits ("ICs") arranged on trays and received by said test handler in magazines containing a plurality of such stacked trays, said test system comprising:
    a loader for receiving magazines containing said trays having said ICs to be tested and transferring said trays from said magazines to a position for access to said ICs to be tested;
    a plurality of test trays which circulate through a loop-like path formed in said test handler;
    a first pick and place mechanism for transferring ICs from said trays to said test trays;
    at least one test chamber arranged in said loop-like path for testing said ICs carried by said test trays;
    a second pick and place mechanism for sorting said ICs following testing in accordance with the results of said testing;
    an unloader for transferring trays containing sorted ICs and returning them to magazines in accordance with the test results;
    a plurality of sensors arranged in each position of said test system for sensing at least a flow of said ICs on said trays and said test trays;

a display for showing test conditions in said test system, said display notifying an occurrence of an error in said test system and showing a general position and specific position of said error, said general position and said specific position are switched one another on said display; and a control unit for controlling overall procedures of testing operation in said test handler, said control unit detecting said error in said test handler from signals provided from said sensors and instructing said display to show the error information.

11. A method for indicating an error in an automatic test handler for handling integrated circuits ("ICs") to be tested wherein said ICs are aligned on trays, comprising the steps of:

a. providing a plurality of sensors in each position of said automatic test handler;

b. detecting a flow of said ICs on said trays in said automatic test handler by said sensors;

c. transferring information on said flow of said ICs to a controller which determines whether there is an error in said automatic test handler based on said information;

d. displaying an operating state screen when no error has happened and changing said screen to an alarm screen when an error is detected in said automatic test handler under the control of said controller;

e. selectively illustrating a general position of said error or a specific position of said error in said automatic test handler after said alarm screen is displayed.

* * * * *